(12) United States Patent
Lee

(10) Patent No.: US 9,391,048 B2
(45) Date of Patent: Jul. 12, 2016

(54) SEMICONDUCTOR PACKAGE

(71) Applicant: Jong-joo Lee, Suwon-si (KR)

(72) Inventor: Jong-joo Lee, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 112 days.

(21) Appl. No.: 14/201,756

(22) Filed: Mar. 7, 2014

(65) Prior Publication Data

US 2014/0252656 A1 Sep. 11, 2014

(30) Foreign Application Priority Data

Mar. 8, 2013 (KR) ........................ 10-2013-0025253

(51) Int. Cl.
*H01L 23/02* (2006.01)
*H01L 25/065* (2006.01)
*H01L 23/00* (2006.01)

(52) U.S. Cl.
CPC ............ *H01L 25/0657* (2013.01); *H01L 24/49* (2013.01); *H01L 24/73* (2013.01); *H01L 2224/04042* (2013.01); *H01L 2224/32145* (2013.01); *H01L 2224/32225* (2013.01); *H01L 2224/48145* (2013.01); *H01L 2224/48227* (2013.01); *H01L 2224/49175* (2013.01); *H01L 2224/73265* (2013.01); *H01L 2224/9202* (2013.01); *H01L 2225/0651* (2013.01); *H01L 2225/06506* (2013.01); *H01L 2225/06541* (2013.01); *H01L 2225/06562* (2013.01); *H01L 2924/00014* (2013.01); *H01L 2924/181* (2013.01)

(58) Field of Classification Search
CPC ................. H01L 25/0657; H01L 2224/32145; H01L 2225/0651; H01L 2225/06562
USPC .................................... 257/686, 777
See application file for complete search history.

(56) References Cited

U.S. PATENT DOCUMENTS

| 6,025,647 | A | 2/2000 | Shenoy et al. |
| 6,514,794 | B2 | 2/2003 | Haba et al. |
| 6,963,136 | B2 | 11/2005 | Shinozaki et al. |
| 6,972,445 | B2 | 12/2005 | Chang |
| 7,462,930 | B2 * | 12/2008 | Lee et al. ...................... 257/686 |
| 7,768,115 | B2 | 8/2010 | Lee et al. |
| 7,964,948 | B2 | 6/2011 | Lee et al. |
| 8,134,238 | B2 | 3/2012 | Komiya |
| 8,203,204 | B2 | 6/2012 | Kim |
| 8,245,176 | B2 | 8/2012 | Silvestri |
| 2004/0007778 | A1 | 1/2004 | Shinozaki et al. |
| 2005/0046022 | A1 | 3/2005 | Alter |
| 2005/0199994 | A1 * | 9/2005 | Morishita et al. ............. 257/686 |
| 2005/0205982 | A1 * | 9/2005 | Kawano ........................ 257/686 |
| 2008/0111242 | A1 | 5/2008 | Lin et al. |

(Continued)

FOREIGN PATENT DOCUMENTS

KR 100699807 B1 3/2007
KR 100800473 B1 2/2008

Primary Examiner — S. V. Clark
(74) Attorney, Agent, or Firm — Renaissance IP Law Group LLP

(57) ABSTRACT

A semiconductor package, comprising: a substrate; a first semiconductor chip; and at least one second semiconductor chip. The first semiconductor chip and the at least one second semiconductor chip are stacked on the substrate; the first semiconductor chip is electrically connected with the substrate; and an electrical connection of each second semiconductor chip is formed through a secondary input/output buffer of the first semiconductor chip.

25 Claims, 15 Drawing Sheets

(56) References Cited

U.S. PATENT DOCUMENTS

2008/0116585 A1    5/2008  Hsu
2008/0290493 A1*  11/2008  Tsunozaki ............... 257/686
2010/0265753 A1*  10/2010  Alzheimer ............... 365/51
2010/0314772 A1   12/2010  Lee
2011/0193226 A1    8/2011  Kirby et al.
2011/0309468 A1   12/2011  Oh et al.
2012/0272112 A1*  10/2012  Oh et al. ............... 714/727

* cited by examiner

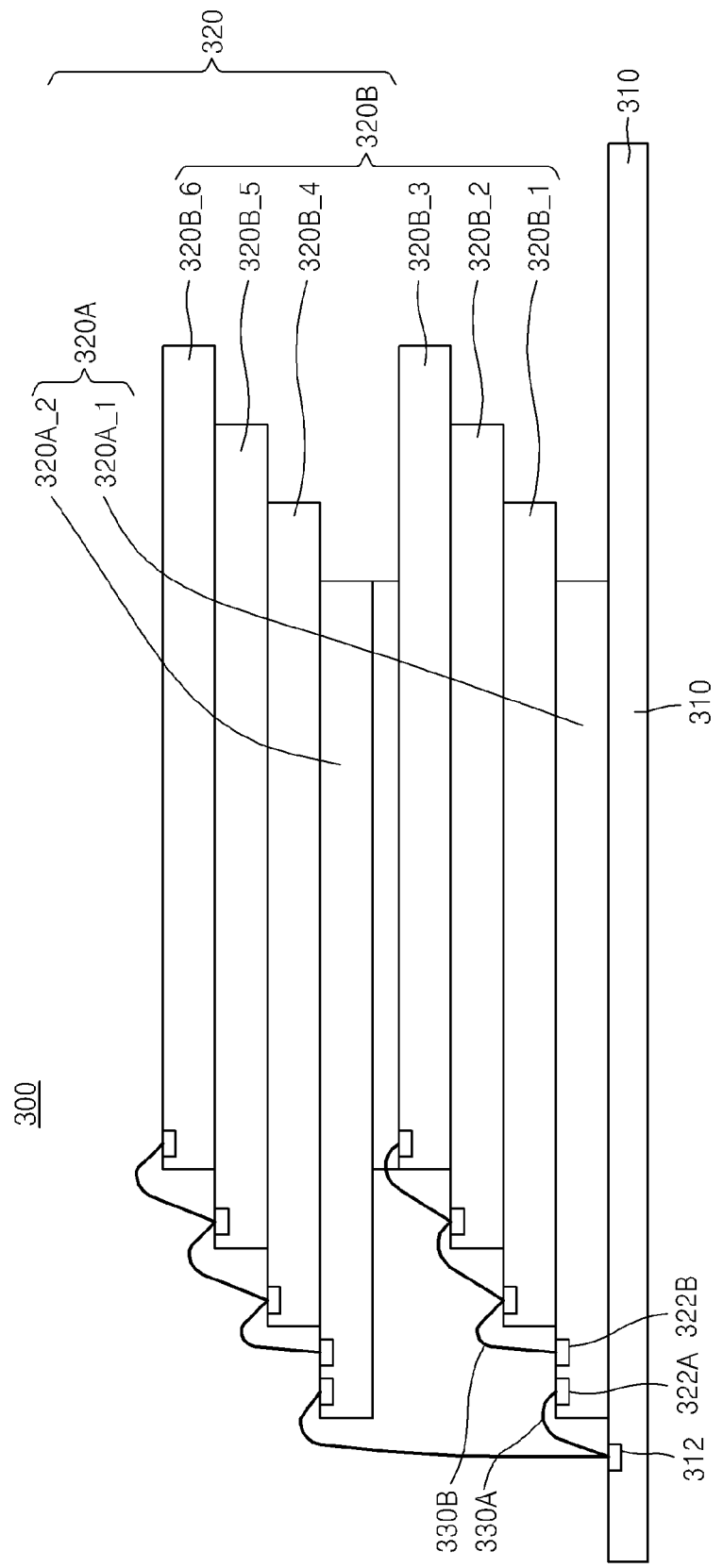

SEMICONDUCTOR PACKAGE

CROSS-REFERENCE TO RELATED APPLICATIONS

This application claims the benefit of Korean Patent Application No. 10-2013-0025253, filed on Mar. 8, 2013, in the Korean Intellectual Property Office, the disclosure of which is incorporated herein in its entirety by reference.

BACKGROUND

Embodiments relate to a semiconductor package, and more particularly, to a semiconductor package in which multiple semiconductor chips are stacked for high-speed operations.

Developing semiconductor technologies require both higher speed and higher capacity. To achieve higher capacity, semiconductor chips are stacked on each other on a substrate and are connected together. However, as the number of semiconductor chips stacked increases, the capacitance loading of semiconductor chips connected in parallel as equivalent circuits with respect to the substrate arithmetically increases. Thus, high-speed operations of semiconductor devices are hindered. Therefore, there is a need for a technique that achieves high capacity without compromising with high-speed operations.

SUMMARY

A semiconductor package, comprising: a substrate; a first semiconductor chip; and at least one second semiconductor chip. The first semiconductor chip and the at least one second semiconductor chip are stacked on the substrate; the first semiconductor chip is electrically connected with the substrate; and an electrical connection of each second semiconductor chip is formed through a secondary input/output buffer of the first semiconductor chip.

A semiconductor chip, comprising: a first pad; a second pad; an internal circuit; a main input/output buffer coupled between the first pad and the internal circuit; and a secondary input/output buffer coupled between the first pad and the second pad.

A semiconductor chip, comprising: a substrate including a device region and a non-device region; a first pad; a second pad; an insulating layer including interconnections; a main input/output buffer disposed in the device region; a secondary input/output buffer disposed in the device region; and an internal circuit disposed in the device region. The main input/output buffer is coupled between the first pad and the internal circuit through the interconnections; and the secondary input/output buffer is coupled between the first pad and the second pad through the interconnections.

A method, comprising: forming a substrate having a device region and a non-device region, the substrate including a main input/output buffer, a second input/output buffer, and an internal circuit formed in the device region; forming an insulating layer including interconnections over the substrate; and forming pads over the insulating layer such that a first pad is coupled to the main input/output buffer and a second pad is coupled to the first pad through the second input/output buffer.

A semiconductor package comprising: a substrate; a plurality of first semiconductor chips; and a plurality of second semiconductor chips. For each of the first semiconductor chips: the first semiconductor chip comprises: an internal circuit; a first pad; a second pad; a main input/output buffer coupled between the first pad and the internal circuit; and a secondary input/output buffer coupled between the first pad and the second pad; the first semiconductor chip is associated with a plurality of the second semiconductor chips; and each of the associated second semiconductor chips is coupled to the substrate through the secondary input/output buffer.

BRIEF DESCRIPTION OF THE DRAWINGS

Embodiments will be more clearly understood from the following detailed description taken in conjunction with the accompanying drawings in which:

FIGS. 11 through 13 are side cross-sectional views illustrating a semiconductor package according to some embodiments;

DETAILED DESCRIPTION OF THE EMBODIMENTS

Figure 1:
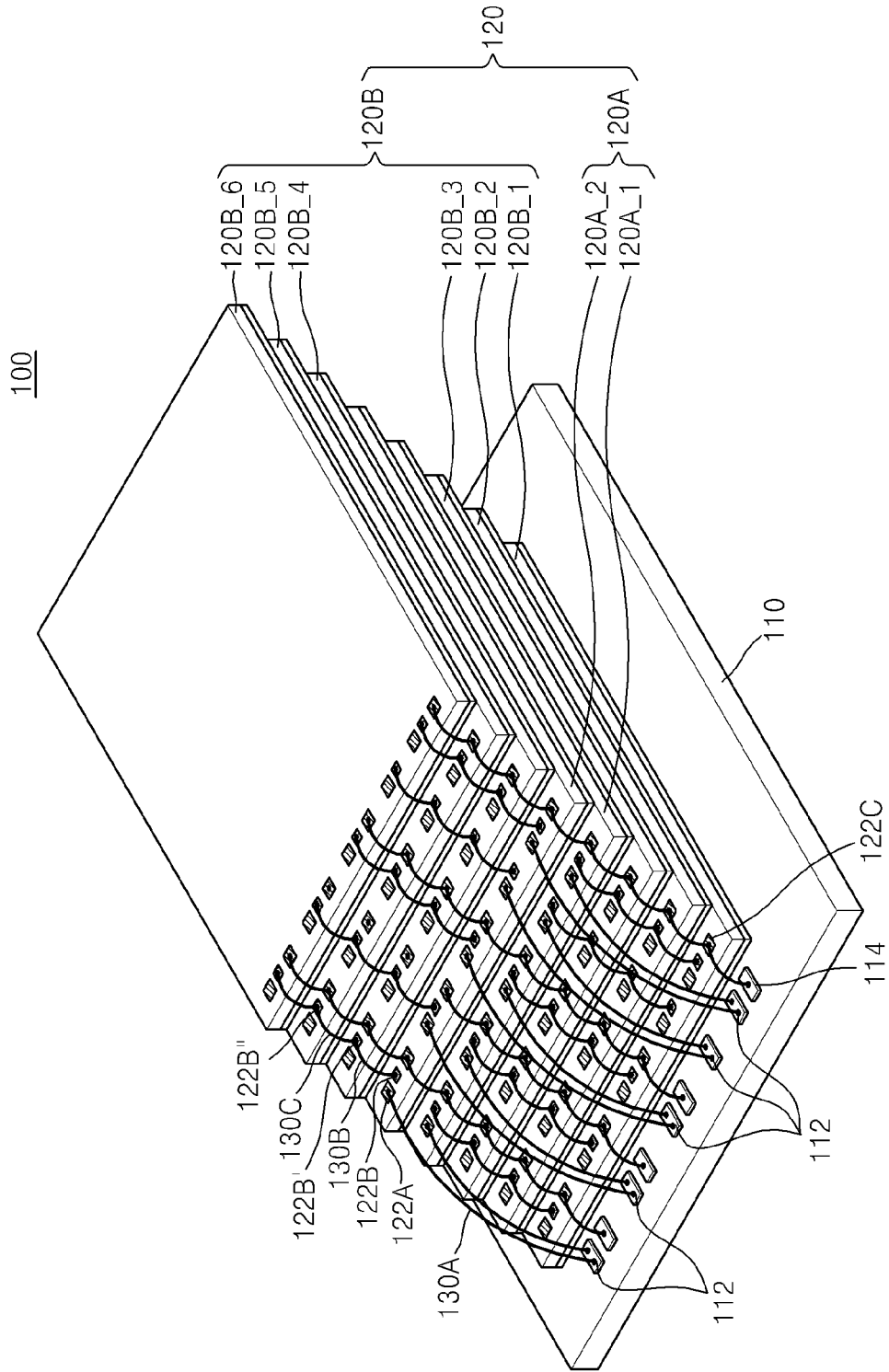
FIG. 1 is a perspective view illustrating a semiconductor package according to an embodiment.

Embodiments will be described with reference to the accompanying drawings. However, embodiments may take other forms and the scope should not be construed as being limited by the particular embodiments described below. The embodiments are provided for a more complete description to those of ordinary skill in the art. Throughout the drawings, like reference numerals refer to like components. Moreover, various elements and regions are illustrated schematically in the drawings. Therefore, the embodiments are not limited by relative sizes or intervals illustrated in the attached drawings.

As used herein, the term "and/or" includes any and all combinations of one or more of the associated listed items. Expressions such as "at least one of," when preceding a list of elements, may modify the entire list of elements or may modify the individual elements of the list.

As used herein, terms such as "first," "second," etc., are used to describe various components. However, it is obvious that the components should not be defined by these terms. The terms are used only for distinguishing one component from another component. For example, a first component may be referred to as a second component and likewise, a second component may also be referred to as a first component, without departing from the teachings herein.

The terminology used herein is for the purpose of describing embodiments and is not intended to be limiting. As used herein, the singular forms are intended to include the plural forms as well, unless the context clearly indicates otherwise. It will be further understood that the terms "comprises" and/or "has" when used in this specification, specify the presence of stated feature, number, step, operation, component, part, and/or a combination thereof but do not preclude the presence or addition of one or more other features, numbers, steps, operations, components, parts and/or combinations thereof.

The terms used herein, including technical and scientific terms, have the same meanings as terms that are generally understood by those skilled in the art, as long as the terms are differently defined. It should be understood that terms defined in a generally-used dictionary have meanings coinciding with those of terms in the related technology. As long as the terms are not defined obviously, they are not ideally or excessively analyzed as formal meanings.

FIG. 1 is a perspective view illustrating a semiconductor package 100 according to an embodiment. Referring to FIG. 1, multiple semiconductor chips 120 are stacked on a substrate 110. The substrate 110 may be, for example, a Printed Circuit Board (PCB), a Flexible Printed Circuit Board (FPCB), or other substrate on which semiconductor chips may be mounted.

The semiconductor chips 120 stacked on the substrate 110 may be a non-volatile memory device. For example, non-volatile memory devices may include, but not limited to Electrically Erasable Programmable Read-Only Memory (EEPROM), flash memory, Phase-change Random Access Memory (PRAM), Resistive RAM (RRAM), Ferroelectric RAM (FeRAM), Magnetic RAM (MRAM), Polymer RAM (PoRAM), Nano Floating Gate Memory (NFGM), molecular electronics memory device, an insulator resistance change memory, or other semiconductor memory devices. The flash memory may be, for example, NAND flash memory or other types of flash memory. Other examples of the semiconductor chips 120 include Dynamic Random Access Memory (DRAM), Static Random Access Memory (SRAM), Synchronous Dynamic Random Access Memory (SDRAM), Rambus DRAM (RDRAM), or the like.

The stacked semiconductor chips 120 may be identical semiconductor chips or different semiconductor chips. Some of the stacked semiconductor chips 120 may be identical semiconductor chips, and the others may be different semiconductor chips. Additional semiconductor chips such as chip sets may be further interposed between the substrate 110 and the semiconductor chips 120.

The semiconductor chips 120 may be encapsulated by an encapsulating material such as epoxy molding resin, and herein, for convenience, the encapsulating material is not illustrated. Although eight (8) semiconductor chips are stacked on the substrate 110 in FIG. 1, the number of stacked semiconductor chips may be greater than or less than 8. For convenience, the semiconductor chips 120 will be referred to as a first chip 120B_1, a second chip 120B_2, a third chip 120B_3, a fourth chip 120A_1, a fifth chip 120A_2, a sixth chip 120B_4, a seventh chip 120B_5, and an eighth chip 120B_6 sequentially from the semiconductor chip closest to the substrate 110.

Some of the plurality of semiconductor chips 120 may be electrically directly connected with multiple pads 112 of the substrate 110, and the others may not be electrically directly connected with the pads 112 of the substrate 110. For example, the fourth chip 120A_1 and the fifth chip 120A_2 are electrically directly connected with the pads 112 of the substrate 110, and these chips are defined as a first semiconductor chip group 120A. The other chips 120B_1, 120B_2, 120B_3, 120B_4, 120B_5, and 120B_6 except for the fourth and fifth chips 120A_1 and 120A_2 are not electrically directly connected with the pads 112 of the substrate 110 and are defined as a second semiconductor chip group 120B. Although the chips 120B_1, 120B_2, 120B_3, 120B_4, 120B_5, and 120B_6 are not directly electrically connected to the pads 112, the chips 120B_1, 120B_2, 120B_3, 120B_4, 120B_5, and 120B_6 may be directly electrically connected to other pads.

In an embodiment, electrically directly connected includes connections that are not direct physical connections, but does not include connections that pass through an intervening semiconductor device. For example, a connector such as a bonding wire, a solder ball, or other interconnection structures may directly connect between pads that are not physically contacting, yet the pads are referred to as being directly electrically connected. However, a connection that passes through a buffer of a semiconductor device would not be electrically directly connected.

While the number of semiconductor chips of the first semiconductor chip group 120A is two (2) in FIG. 1, it may be greater than or less than 2. Moreover, although the number of semiconductor chips of the second semiconductor chip group 120B is six (6) in FIG. 1, it maybe greater than or less than 6.

In particular, the semiconductor chips 120A_1 and 120A_2 of the first semiconductor chip group 120A may include multiple first pads 122A that are directly electrically connected with the pads 112 of the substrate 110 and thus may communicate with the substrate 110 and multiple second pads 122B that are directly electrically connected with and thus may communicate with the semiconductor chips 120B_1, 120B_2, 120B_3, 120B_4, 120B_5, and 120B_6 of the second semiconductor chip group 120B.

The first pads 122A may be connected with the pads 112 of the substrate 110 by a first connector 130A such as, for example, but not limited to, a bonding wire. The second pads 122B may be connected with the semiconductor chips 120B_1, 120B_2, 120B_3, 120B_4, 120B_5, and 120B_6 of the second semiconductor chip group 120B by a second connector 130B such as, for example, but not limited to, a bonding wire. The semiconductor chips 120B_1, 120B_2, 120B_3, 120B_4, 120B_5, and 120B_6 of the second semiconductor chip group 120B may be connected to one another by a third connector 130C such as, for example, but not limited to, a bonding wire.

To sum up, as illustrated in FIG. 1, the semiconductor chips 120A_1 and 120A_2 of the first semiconductor chip group 120A may include the first pads 122A and the second pads 122B. The first pads 122A may be directly electrically connected with the pads 112 of the substrate 110 by the first connector 130A, and the second pads 122B may be directly electrically connected with the semiconductor chips 120B_1, 120B_2, 120B_3, 120B_4, 120B_5, and 120B_6 of the second semiconductor chip group 120B by the second connector 130B.

The first pads 122A and the second pads 122B may be disposed along edges of the semiconductor chips 120A_1 and 120A_2 of the first semiconductor chip groups 120A. However, the first pads 122A and the second pads 122B may be disposed in other locations, such as centers of the semiconductor chips 120A_1 and 120A_2 of the first semiconductor chip group 120A, respectively.

Active surfaces of the semiconductor chips 120A_1 and 120A_2 of the first semiconductor chip group 120A and active surfaces of the semiconductor chips 120B_1, 120B_2, 120B_3, 120B_4, 120B_5, and 120B_6 of the second semiconductor chip group 120B that are connected to the semiconductor chips 120A_1 and 120A_2 may be oriented in the same direction. In a particular embodiment, the active surfaces of the semiconductor chips 120A_1 and 120A_2 of the first semiconductor chip group 120A and all of the active surfaces of the semiconductor chips 120B_1, 120B_2, 120B_3, 120B_4, 120B_5, and 120B_6 of the second semiconductor chip group 120B may be oriented in the same direction.

As illustrated in FIG. 1, multiple pads 112 are on the substrate 110, and are electrically connected with terminals of the first through eighth chips 120B_1, 120B_2, 120B_3, 120A_1, 120A_2, 120B_4, 120B_5, and 120B_6, respectively, to form one channel. The semiconductor package 100 may communicate with an external device through the channel. As illustrated in FIG. 1, one pad 112 on the substrate 110 may be directly electrically connected with multiple first pads 122A of the semiconductor chips 120A_1 and 120A_2.

Figure 2:
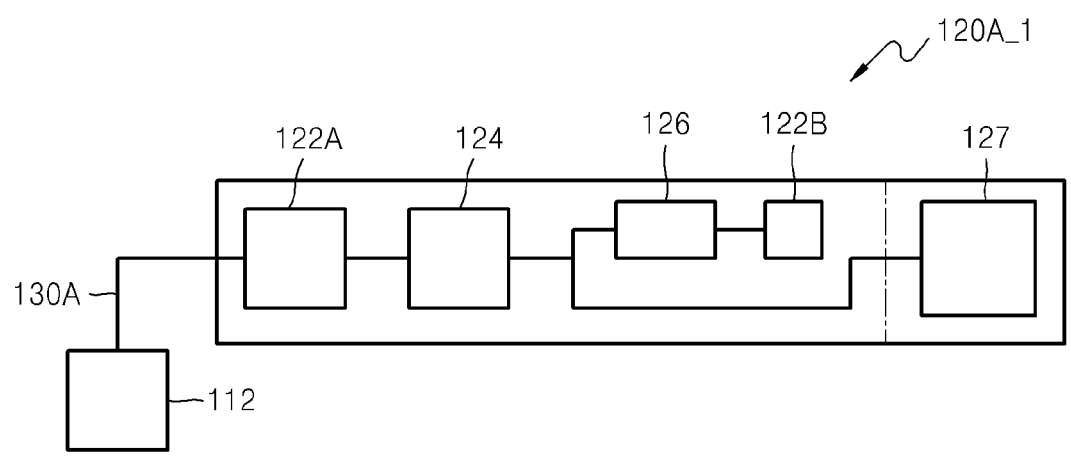
FIGS. 2-4 are equivalent circuit diagrams conceptually illustrating semiconductor chips of a first semiconductor chip group in light of a first pad and a second pad according to embodiments.

FIG. 2 is an equivalent circuit diagram conceptually illustrating the semiconductor chip 120A_1 of the first semiconductor chip group 120A in light of first pads 122A and the second pads 122B according to an embodiment. Referring to FIG. 2, the semiconductor chip 120A_1 of the first semiconductor chip group 120A includes a main input/output buffer 124 connected to the first pad 122A for input/output operations with the pad 112 of the substrate 110. The main input/output buffer 124 may be electrically connected with an internal circuit 127 of the semiconductor chip 120A_1.

The main input/output buffer 124 may include an input buffer and an output driver. The main input/output buffer 124 may be configured to deliver a signal from outside through the first pad 122A to the internal circuit 127, or may deliver a signal from the internal circuit 127 to outside through the first pad 122A.

A secondary input/output buffer 126 may be further connected to the main input/output buffer 124. The second pad 122B may be connected to the secondary input/output buffer 126. In other words, one end of the secondary input/output buffer 126 is connected between the main input/output buffer 124 and the internal circuit 127, and the other end of the secondary input/output buffer 126 is connected to the second pad 122B.

The secondary input/output buffer 126 may also include an input buffer and an output driver. The secondary input/output buffer 126 may deliver a signal from outside through the second pad 122B to the main input/output buffer 124, or may deliver a signal from the main input/output buffer 124 to outside through the second pad 122B. In an embodiment, the main input/output buffer 124 and the secondary input/output buffer 126 may form a data bus, a command/address bus, or another communication link.

Figure 3:
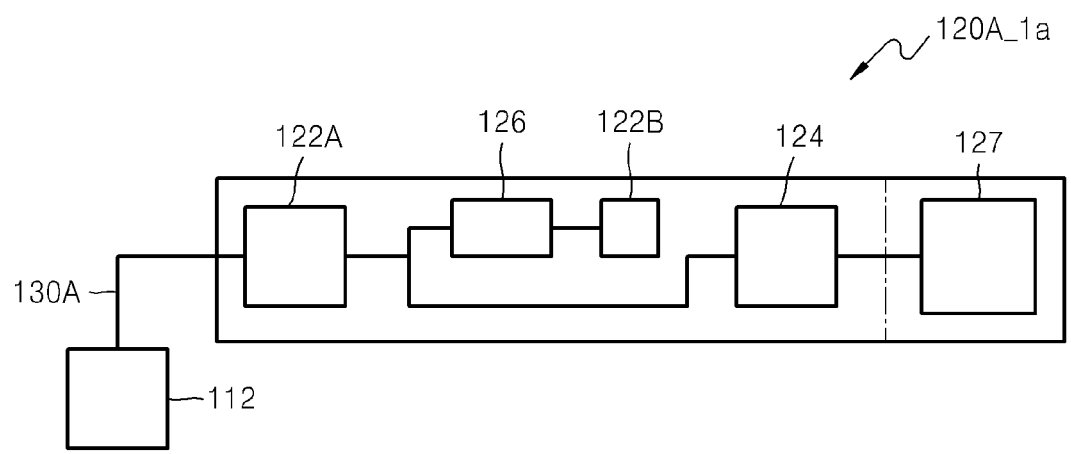

FIG. 3 is an equivalent circuit diagram conceptually illustrating a semiconductor chip 120A_1a of the first semiconductor chip group 120A in light of the first pad 122A and the second pad 122B according to another embodiment. Referring to FIG. 3, the semiconductor chip 120A_1a of the first semiconductor chip group 120A includes the main input/output buffer 124 connected to the first pad 122A for input/output operations with the pads 112 of the substrate 110. The main input/output buffer 124 may be electrically connected with the internal circuit 127 of the semiconductor chip 120A_1a.

The main input/output buffer 124 may include an input buffer and an output driver. The main input/output buffer 124 may be configured to deliver a signal from outside to the internal circuit 127 through the first pad 122A, or deliver a signal output from the internal circuit 127 to outside through the first pad 122A.

The secondary input/output buffer 126 may be further connected to the first pads 122A. The second pad 122B may be connected to the secondary input/output buffer 126. For example, one end of the secondary input/output buffer 126 may be connected between the first pad 122A and the main input/output buffer 124, and the other end of the secondary input/output buffer 126 may be connected to the second pad 122B. In another example, the secondary input/output buffer 126 may be directly connected to the first pad 122A.

The secondary input/output buffer 126 may also include an input buffer and an output driver. The secondary input/output buffer 126 may be configured to deliver a signal from outside to the first pad 122A through the second pad 122B, or deliver a signal from the first pad 122A to outside through the second pad 122B. Thus, the main input/output buffer 124 and the secondary input/output buffer 126 may form a data bus, a command/address bus, or another communication link.

The secondary input/output buffer 126 may have a smaller buffering capacity than the main input/output buffer 124. To this end, at least some of elements of the secondary input/output buffer 126 may have smaller sizes than elements of the main input/output buffer 124. Alternatively, the secondary input/output buffer 126 may have only some of the elements of the main input/output buffer 124. In another embodiment, the secondary input/output buffer 126 may be substantially the same as the main input/output buffer 124.

Figure 4:
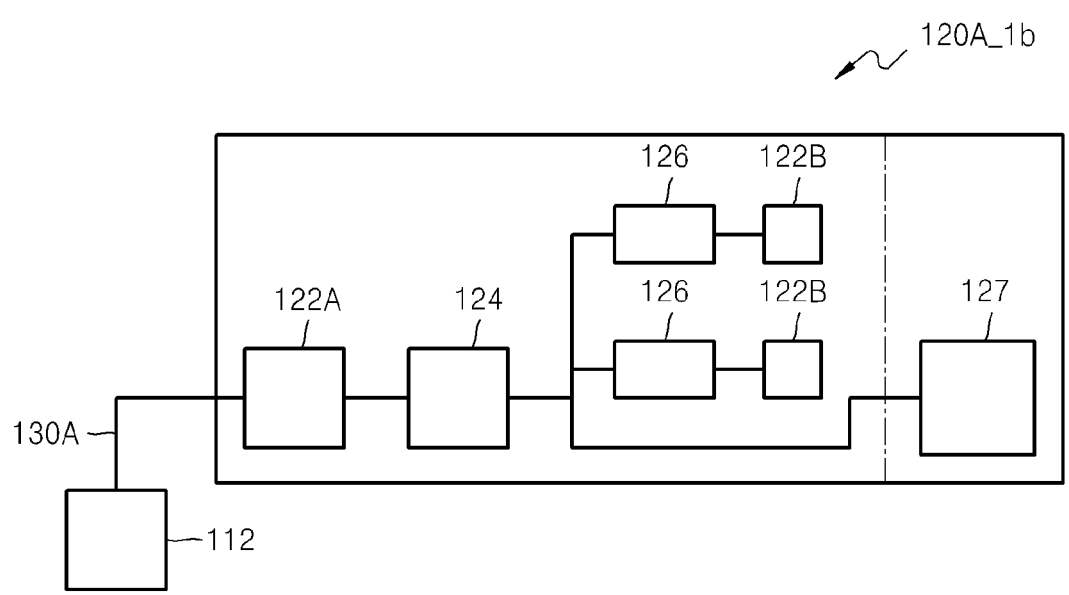

FIG. 4 is an equivalent circuit diagram conceptually illustrating the semiconductor chip 120A_1b of the first semiconductor chip group 120A in light of first pads 122A and the second pads 122B according to another embodiment. In this embodiment, the elements of the semiconductor chip 120A_1b are similar to the semiconductor chip 120A_1 described with respect to FIG. 2. However, in this embodiment, multiple secondary input/output buffers 126 may be coupled to the main input/output buffer 124. Each secondary input/output buffer 126 may be coupled to an associated second pad 122B. Accordingly, a data bus, a command/address bus, or another communication link may be formed with the main input/output buffer 124 and each of the secondary input/output buffers 126. In another embodiment, multiple secondary input/output buffers 126 and associated second pads 122B may be present in the semiconductor chip 120A_1a described with respect to FIG. 3.

Figure 5:
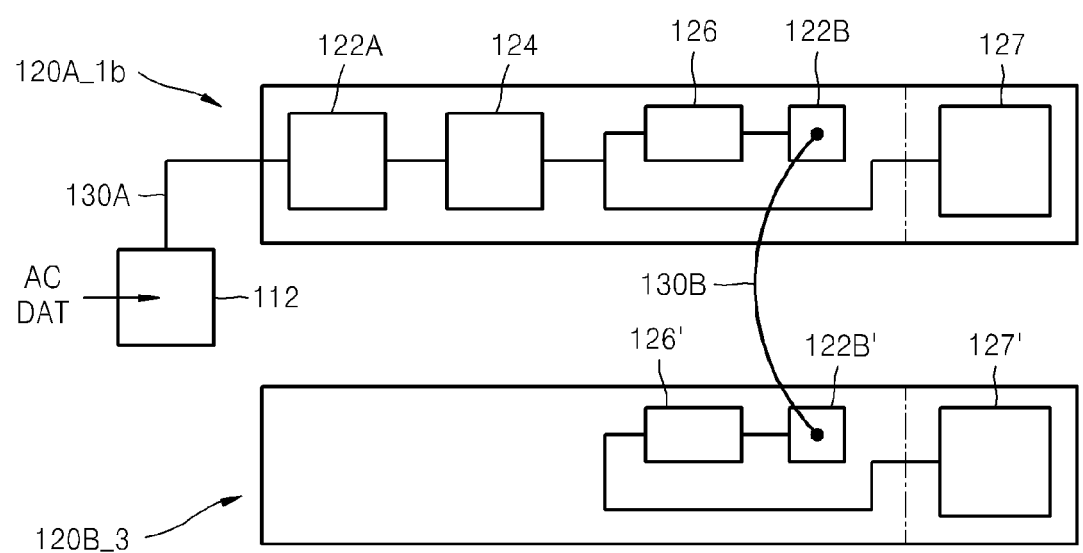
FIG. 5 is an equivalent circuit diagram conceptually illustrating a connection relationship between a semiconductor chip of a first semiconductor chip group and a semiconductor chip of a second semiconductor chip group according to an embodiment.

FIG. 5 is an equivalent circuit diagram conceptually illustrating a connection relationship between the semiconductor chip 120A_1 of the first semiconductor chip group 120A and the semiconductor chip 120B_3 of the second semiconductor chip group 120B according to an embodiment. Although the semiconductor chip 120A_1 will be used as an example, other semiconductor chip 120A_1 such as those described with respect to FIGS. 3 and 4 may be similarly used.

Since the semiconductor chip 120A_1 of the first semiconductor chip group 120A is illustrated as being directly connected with the third chip 120B_3 among the semiconductor chips of the second semiconductor chip group 120B in FIG. 1, the semiconductor chip 120A_1 of the first semiconductor chip group 120A is illustrated as being connected to the third chip 120B_3 also in FIG. 5 for consistency. However, the semiconductor chip 120A_1 may be connected to other semiconductor chips of the second semiconductor chip group 120B.

Referring to FIG. 5, a pad 122B' of the third chip 120B_3 may be connected to an internal circuit 127' of the third chip 120B_3 via an input/output buffer 126'. In an embodiment, the input/output buffer 126' may be substantially similar to the secondary input/output buffer 126 of the semiconductor chip 120A_1; however, in other embodiments, the input/output buffer 126' may be different from the secondary input/output buffer 126. The internal circuit 127' of the third chip 120B_3 may be identical to the internal circuit 127 of the semiconductor chip 120A_1 of the first semiconductor chip group 120A; however, in other embodiments, the internal circuit 127' of the third chip 120B_3 may be different from the internal circuit 127.

The pad 122B' of the third chip 120B_3 may be directly electrically connected with the second pad 122B of the semiconductor chip 120A_1 of the first semiconductor chip group 120A via the second connector 130B. Thus, the secondary input/output buffer 126 of the semiconductor chip 120A_1 of the first semiconductor chip group 120A may be electrically connected with the input/output buffer 126' of the third chip 120B_3. The second connector 130B may be, for example, but not limited to, a bonding wire.

A signal, such as an access signal AC, a data signal DAT, or other similar signals input from the pads 112 of the substrate 110 may be delivered to the main input/output buffer 124 through the first connector 130A. Next, the signal may be delivered to the internal circuit 127 and the secondary input/output buffer 126 of the semiconductor chip 120A_1. If the signal is destined to the third chip 120B_3 of the second semiconductor chip group 120B, the signal may be delivered to the third chip 120B_3 through the second pad 122B and the second connector 130B. In the third chip 120B_3, the signal may be delivered to the internal circuit 127' through the input/output buffer 126'.

Figure 6:
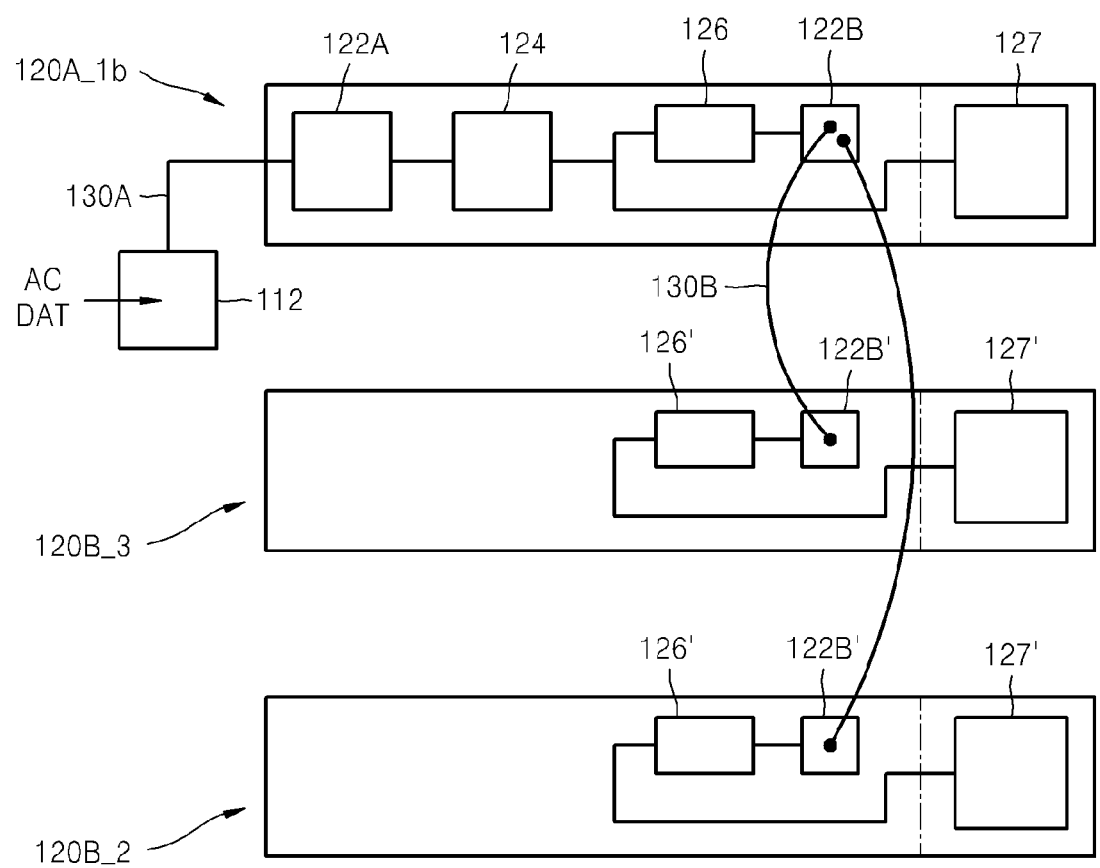
FIG. 6 is an equivalent circuit diagram conceptually illustrating a connection relationship between a semiconductor chip of a first semiconductor chip group and two or more semiconductor chips of a second semiconductor chip group according to an embodiment.

FIG. 6 is an equivalent circuit diagram conceptually illustrating a connection relationship between a semiconductor chip of a first semiconductor chip group and two or more semiconductor chips of a second semiconductor chip group according to another embodiment. In this embodiment, the semiconductor chip 120A_1 and the semiconductor chip 120B_3 may be similar to those of FIG. 5 and coupled as described with respect to FIG. 5. However, another semiconductor chip 120B_2 may be electrically directly connected to the semiconductor chip 120A_1. The semiconductor chip 120B_2 is coupled to the pad 122B through a different connector 130B than the semiconductor chip 120B_3. Although only two semiconductor chips are illustrated as coupled to the semiconductor chip 120A_1 any number of semiconductor chips may be similarly coupled.

Figure 7:
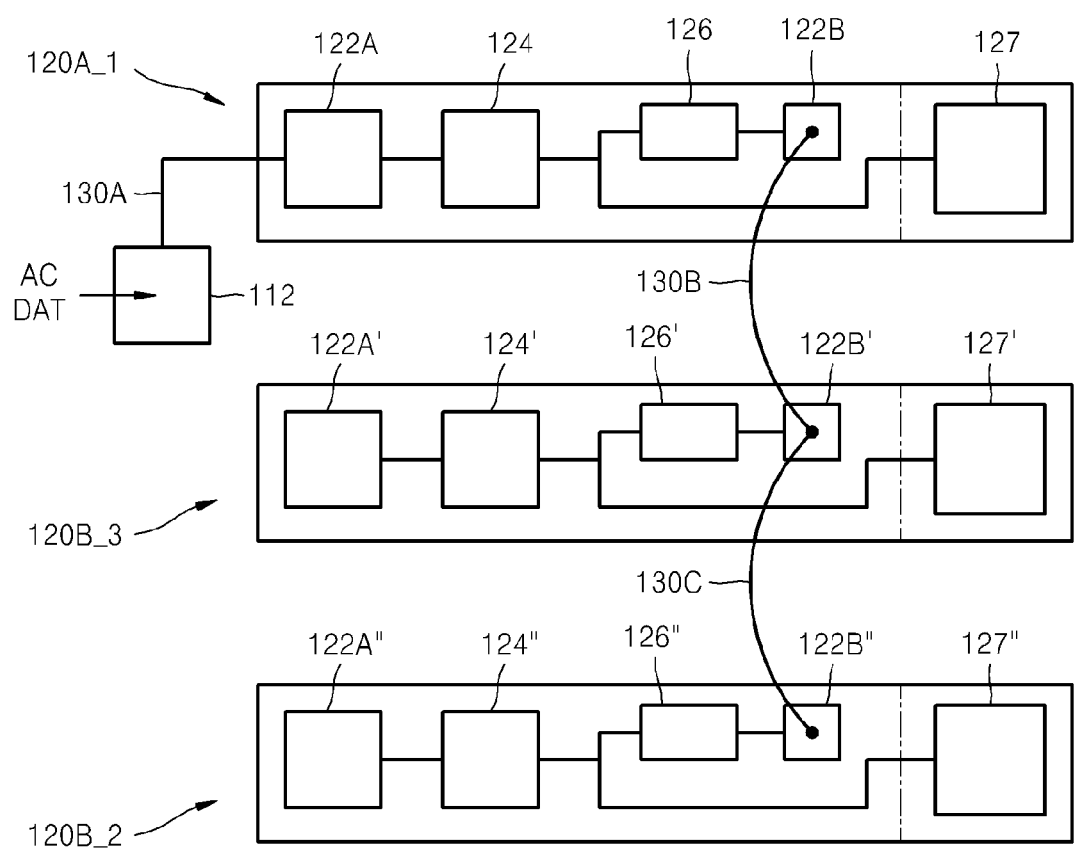
FIG. 7 is an equivalent circuit diagram conceptually illustrating a connection relationship between a semiconductor chip of a first semiconductor chip group and two or more semiconductor chips of a second semiconductor chip group according to an embodiment.

FIG. 7 is an equivalent circuit diagram conceptually illustrating a connection relationship between the semiconductor chip 120A_1 of the first semiconductor chip group 120A and two or more semiconductor chips of the second semiconductor chip group 120B according to an embodiment. Here, semiconductor chips 120B_3 and 120B_2 are used as an example; however, any number of semiconductor chips may be used. Also in FIG. 7, similar to FIG. 5, the semiconductor chip 120A_1 of the first semiconductor chip group 120A is illustrated as being connected to the third chip 120B_3 and the second chip 120B_2 among the semiconductor chips of the second semiconductor chip group 120B.

Referring to FIGS. 1 and 7 together, the semiconductor chip 120A_1 of the first semiconductor chip group 120A and the third chip 120B_3 and the second chip 120B_2 of the second semiconductor chip group 120B are sequentially connected by the second connector 130B and the third connector 130C. Configurations of and a relationship between the semiconductor chip 120A_1 and the third chip 120B_3 have already been described with reference to FIG. 5 and thus will not be described in detail.

A pad 122B" of the second chip 120B_2 may be connected to an internal circuit 127" of the second chip 120B_2 via an input/output buffer 126". Optionally, the input/output buffer 126" may be identical to the secondary input/output buffer 126 of the semiconductor chip 120A_1 and/or the secondary input/output buffer 126' of the third chip 120B_3. The internal circuit 127" of the second chip 120B_2 may be substantially similar to the internal circuit 127 of the semiconductor chip 120A_1 of the first semiconductor chip 120A and/or the internal circuit 127' of the third chip 120B_3.

The pad 122B" of the second chip 120B_2 may be directly connected with the pad 122B' of the third chip 120B_3 by the third connector 130C. The third connector 130C may be, for example, but not limited to, a bonding wire.

Optionally, the second chip 120B_2 may be a semiconductor chip that is substantially similar to the third chip 120B_3. Optionally, the second chip 120B_2 may be a semiconductor chip that is substantially similar to the third chip 120B_3, and the semiconductor chip 120A_1 of the first semiconductor chip group 120A. The secondary input/output buffers 126' and 126" of the second chip 120B_2 and the third chip 120B_3 may be connected in parallel to the secondary input/output buffer 126 of the semiconductor chip 120A_1 of the first semiconductor chip group 120A.

If the second chip 120B_2 is a semiconductor chip that is identical to the third chip 120B_3, and the semiconductor chip 120A_1 of the first semiconductor chip group 120A, as illustrated in FIG. 7, pads 122A' and 122A" corresponding to the first pads 122A and input/output circuits 124' and 124" corresponding to the main input/output buffer 124 exist in the third chip 120B_3 and the second chip 120B_2. However, in this case, the pads 122A' and 122A" and the input/output circuits 124' and 124" are dummy devices that do not contribute to operations of the third chip 120B_3 and the second chip 120B_2. Alternatively, the pads 122A' and 122A" and the input/output circuits 124' and 124" may be merely disabled through a particular configuration, fuses, or the like.

Continuing referring to FIGS. 1 and 7, two (2) semiconductor chips 120A_1 and 120A_2 exist in the first semiconductor chip group 120A and 6 semiconductor chips 120B_1, 120B_2, 120B_3, 120B_4, 120B_5, and 120B_6 exist in the second semiconductor chip group 120B. Similarly with FIG. 7, each three of the six semiconductor chips 120B_1, 120B_2, 120B_3, 120B_4, 120B_5, and 120B_6 of the second semiconductor chip group 120B may be connected as equivalent circuits in parallel to the two semiconductor chips 120A_1 and 120A_2. In other words, corresponding pads of the semiconductor chips 120B_1, 120B_2, and 120B_3 of the second semiconductor chip group 120B may be connected as equivalent circuits in parallel to the second pads 122B of the semiconductor chip 120A_1 of the first semiconductor chip group 120A. In addition, corresponding pads of the semiconductor chips 120B_4, 120B_5, and 120B_6 of the second semiconductor chip may be connected as equivalent circuits in parallel to the second pads 122B of the semiconductor chip 120A_2 of the first semiconductor chip group 120A.

Referring back to FIG. 1, all channels formed between the substrate 110 and the semiconductor chips 120 may not operate at high speed, and some channels including channels for power, ground, chip selection, and monitoring may operate at low speed. Low-speed pads 114 that involve low-speed operations exist in the respective semiconductor chips 120 to form one channel, and in this case, the third pads 122C of the first through eighth chips 120B_1, 120B_2, 120B_3, 120A_1, 120A_2, 120B_4, 120B_5, and 120B_6 may be sequentially connected from the low-speed pads 114 of the substrate 110. Herein, the low-speed pads 114 are defined as referring to pads that manage an operation for power, ground, chip selection, or monitoring.

If the third pads 122C of the stacked semiconductor chips are sequentially connected from the pads 114 of the substrate 110, the third pads 122C may be interpreted as being connected as equivalent circuits in parallel to the pads 114 of the substrate 110. The respective semiconductor chips are connected in parallel to the substrate 110 and may operate at low speed. Accordingly, the possibility of malfunction is reduced in spite of increase in capacitance loading.

When channels that require high-speed operations are configured as illustrated in FIGS. 1 and 7, semiconductor chips directly electrically connected to the substrate 110 are two semiconductor chips 120A_1 and 120A_2 of the first semiconductor chip group 120A, thus largely reducing capacitance loading. More specifically, since only two semiconductor chips are connected, capacitance loading of the substrate 110 is reduced to about ¼ from when eight semiconductor chips are connected. Since capacitance loading reduction is a factor for high-speed operations of semiconductor devices, the foregoing configuration may contribute to high-speed operations of semiconductor devices.

Figure 8:
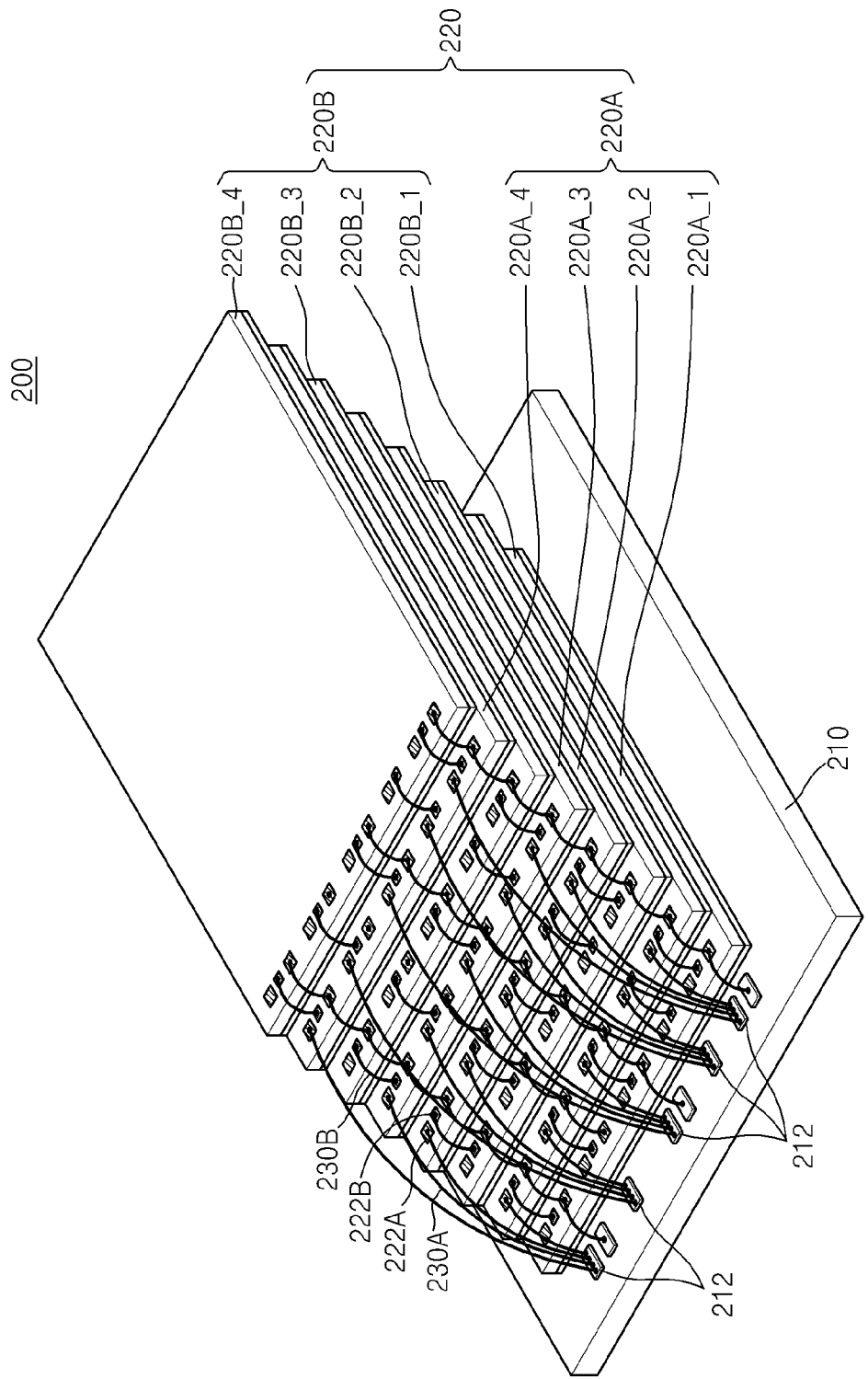
FIG. 8 is a perspective view illustrating a semiconductor package according to another embodiment.

FIG. 8 is a diagram illustrating a semiconductor device 200 according to another embodiment. Referring to FIG. 8, multiple semiconductor chips 220 are stacked on a substrate 210, and the semiconductor chips 220 include a first semiconductor chip group 220A directly electrically connected with the substrate 210 and a second semiconductor chip group 220B that is not directly electrically connected with at least part of the substrate 210.

The semiconductor chips 220 illustrated in FIG. 8 may be encapsulated by an encapsulating material such as epoxy molding resin, and herein for convenience, the encapsulating material is not illustrated. Although eight (8) semiconductor chips are illustrated as being stacked on the substrate 210 in FIG. 8, the number of stacked semiconductor chips may be greater than or less than 8. Herein, for convenience, semiconductor chips will be referred to as a first chip 220B_1, a second chip 220A_1, a third chip 220B_2, a fourth chip 220A_2, a fifth chip 220A_3, a sixth chip 220B_3, a seventh chip 220A_4, and an eighth chip 220B_4 sequentially from the semiconductor chip that is closest to the substrate 210.

According to the foregoing definitions of the first semiconductor chip group 220A and the second semiconductor chip group 220B, the second chip 220A_1, the fourth chip 220A_2, the fifth chip 220A_3, and the seventh chip 220A_4 belong to the first semiconductor chip group 220A, and the first chip 220B_1, the third chip 220B_2, the sixth chip 220B_3, and the eighth chip 220B_4 belong to the second semiconductor chip group 220B.

To describe a semiconductor chip of the first semiconductor chip group 220A, the fifth chip 220A_3 will be used as an example. The fifth chip 220A_3 may include first pads 222A that are directly electrically connected with pads 212 of the substrate 210 to communicate with the substrate 210 and second pads 222B that are directly electrically connected with the sixth chip 220B_3 of the second semiconductor chip group 220B to communicate with the semiconductor chip 220B_3.

The first pads 222A may be connected to the pads 212 of the substrate 210 by the first connector 230A such as, for example, a bonding wire. The second pads 222B may be connected to the semiconductor chip 220B_3 of the second semiconductor chip group 220B by the second connector 230B such as, for example, a bonding wire.

The fifth chip 220A_3 of the first semiconductor chip group 220A includes a main input/output buffer and a secondary input/output buffer as illustrated in FIGS. 1 through 7 and a connection relationship between the main input/output buffer and the secondary input/output buffer has already been described in detail with reference to FIGS. 2 through 7 and thus will not be described repetitively. In particular, in a configuration of FIG. 8, a semiconductor chip of the second semiconductor chip group 220B corresponds to a semiconductor chip of the first semiconductor chip group 220A in one-to-one correspondence, and thus the configuration illustrated in FIG. 5 may be used.

Like in FIGS. 5 and 7, the semiconductor chips 220A_1, 220A_2, 220A_3, and 220A_4 of the first semiconductor chip group 220A and the corresponding semiconductor chips 220B_1, 220B_2, 220B_3, and 220B_4 of the second semiconductor chip group 220B may be substantially similar semiconductor chips or different semiconductor chips. In the former case, pads and input/output circuits in the semiconductor chips 220B_1, 220B_2, 220B_3, and 220B_4 of the second semiconductor chip group 220B, which correspond to first pads and main input/output buffers of the semiconductor chips 220A_1, 220A_2, 220A_3, and 220A_4 of the first semiconductor chip group 220A, may be disabled or dummy devices that do not contribute to semiconductor chips' operations.

If a channel that requires high-speed operations is configured as illustrated in FIG. 8, only the four semiconductor chips 220A_1, 220A_2, 220A_3, and 220A_4 of the first semiconductor chip group 220A are directly electrically connected to the substrate 210, reducing capacitive loading. More specifically, since only four semiconductor chips are connected, capacitance loading of the substrate 210 is reduced to about ½ from when eight semiconductor chips are connected. Since capacitance loading reduction is a factor for high-speed operations of semiconductor devices, the foregoing configuration may contribute to high-speed operations of semiconductor devices.

The number of semiconductor chips of the first semiconductor chip group 220A is not particularly limited and may be 1 or more, preferably, 2 or more, but may be equal to or less than ½ of the number of stacked semiconductor chips.

Figure 9:
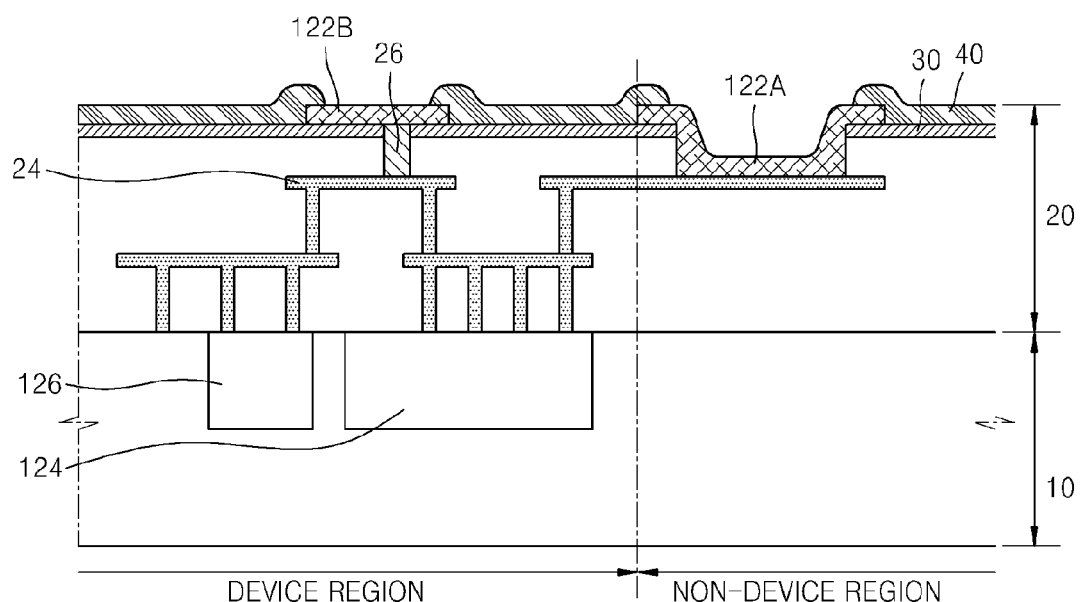
FIG. 9 is a cross-sectional view illustrating a partial cross-section of a semiconductor chip of a first semiconductor chip group according to an embodiment.

FIG. 9 is a cross-sectional view illustrating a partial cross section of a semiconductor chip of the first semiconductor chip group 220A according to an embodiment. Referring to FIG. 9, a semiconductor chip may include a device region in which semiconductor devices are densely formed and a non-device region in which no device is formed. On a substrate-and-device layer 10 of the device region, the main input/output buffer 124 and the secondary input/output buffer 126 may be disposed. The semiconductor devices formed in the device region may be properly connected by a metallic interconnection 24 in an insulating layer 20.

The insulating layer 20 may have a structure in which multiple insulating films are stacked, and the top film may be a passivation layer 30 such as, for example, a silicon nitride layer.

The first pad 122A and the second pad 122B may be provided by a redistribution process. In particular, the first pad 122A is provided in the non-device region, and the second pad 122B is provided in the device region and on the passivation layer 30. In particular, the second pad 122B may be provided over the main input/output buffer 124 and/or the secondary input/output buffer 126.

The second pad 122B may be electrically connected to the metallic interconnection 24 through a contact plug 26. Although the second pad 122B and the contact plug 26 are illustrated as being physically distinguishable in FIG. 9, they may be formed integrally.

Since the first pad 122A is not formed on the passivation layer 30, a shock applied when a connector such as a bonding wire is bonded is delivered down to the substrate 110. For this reason, if the first pad 122A is disposed in the device region, the devices may be damaged. To prevent damage of the devices, the first pad 122A may be disposed in the non-device region.

Since the second pad 122B is formed on the passivation layer 30, the shock applied when the connector is bonded may be reduced or blocked by the passivation layer 30. Therefore, even when semiconductor devices are formed under the passivation layer 30, the semiconductor devices are not likely to be damaged due to the shock. As such, when the second pad 122B is formed on the passivation layer 30, formation of the second pad 122B in the device region is allowed and thus chip size increase is not necessary. In other words, without chip size increase, high-speed operations of a semiconductor package may be achieved by providing the second pad 122B.

Although the second pad 122B has been described as being formed on the passivation layer 30 and over the device region, the second pad 122B may be formed in different locations. For example, the second pad 122B may be formed in the non-device region. Moreover, the second pad 122B may not be formed on the passivation layer 30, similar to the first pad 122A.

Figure 10A:
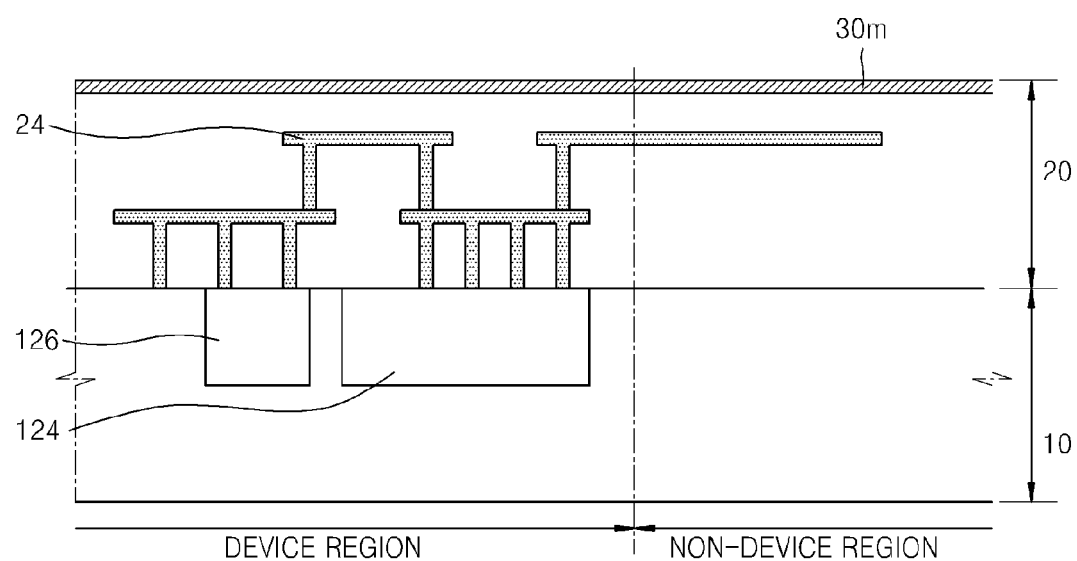
FIGS. 10A through 10C are partial cross-sectional diagrams illustrating a method of manufacturing a semiconductor chip having a structure illustrated in FIG. 9 in sequence according to an embodiment.
Figure 10B:
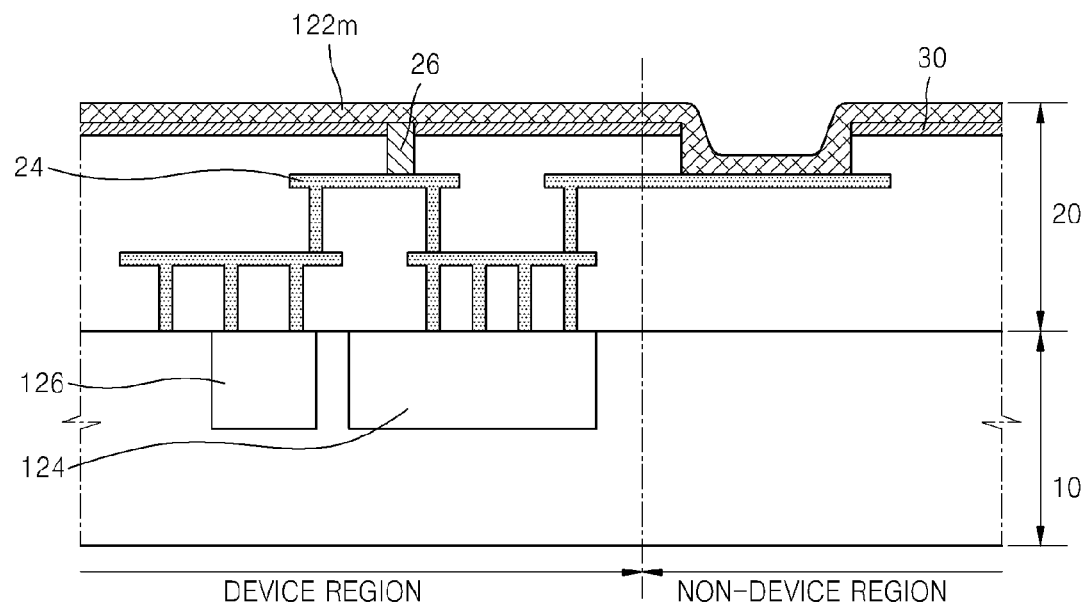
Figure 10C:
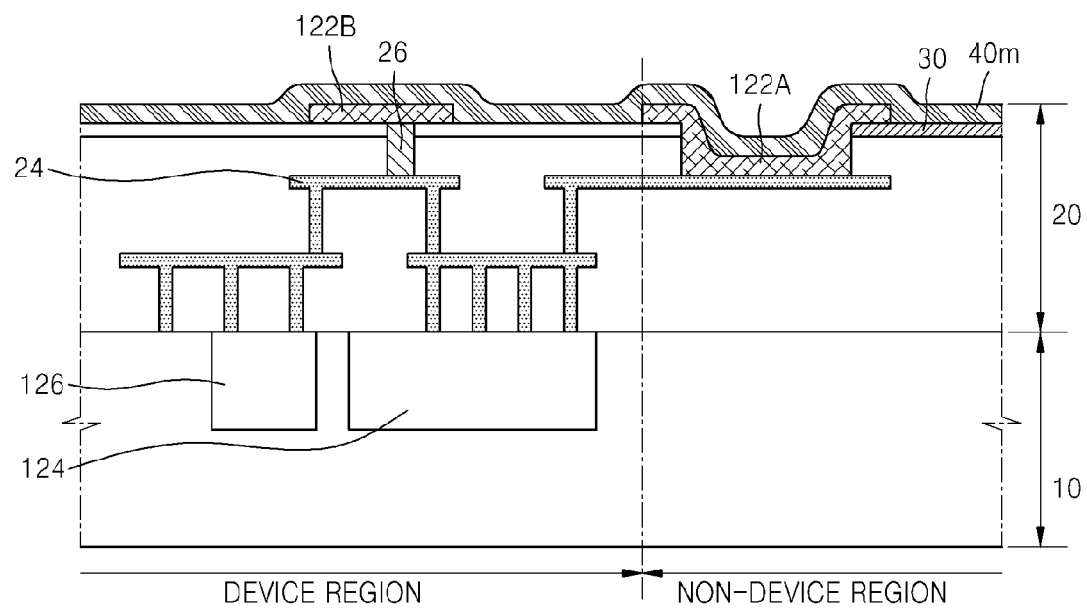

FIGS. 10A through 10C are partial cross-sectional diagrams illustrating a method of manufacturing a semiconductor chip having a structure illustrated in FIG. 9 in sequence according to an embodiment. Referring to FIG. 10A, a substrate including an device region and a non-device region is provided, and semiconductor devices including the main input/output buffer 124 and the secondary input/output buffer 126 in the device region are formed, such that the substrate-and-device layer 10 are formed. Next, an interlayer insulating film including a contact hole to be used for an interlayer interconnection is formed on the substrate-and-device layer 10, and a series of processes that form a contact plug are properly repeated, such that the insulating layer 20 including the metallic interconnection 24 is formed. While the insulating layer 20 is illustrated as being a single layer in FIG. 8A, multiple insulating films made of different or identical materials may be stacked in the insulating layer 20. A passivation material film 30m may be formed using a material such as a silicon nitride on top of the insulating layer 20.

Manufacturing of the semiconductor devices and formation of the interlayer insulating film and the metallic interconnection are well known to those of ordinary skill in the art, and thus will not be described in detail.

Referring to FIG. 10B, the metallic interconnection 24 which is to be connected with first pads and second pads may be exposed. In this case, exposure of the metallic interconnection for connection with the second pads may be such that only a limited region of the metallic interconnection is exposed through a contact hole or a large region of the metallic interconnection is exposed. This may be determined later depending on an electrical characteristics of signals passing through the pads.

Next, a pad material film 122m may be conformally formed. The pad material film 122m may be a conductive material film, may be made of a metallic material, an electric-conductive metallic nitride, an electric-conductive metallic oxide, or the like. The pad material film 122m may be a single layer or a stacked film in which multiple materials are stacked.

When the pad material film 122m is formed, the contact hole may be filled to integrally form the contact plug 26, or after the contact plug 26 is formed, the pad material film 122m may be separately formed. Formation of the contact hole and formation of the material film are well known to those of ordinary skill in the art and thus will not be described in detail.

Referring to FIG. 10C, for example, the first pad 122A and the second pad 122B may be formed through photolithography, and then an insulating material film 40m may be coated on the first pad 122A and the second pad 122B. To expose the first pad 122A and the second pad 122B, the insulating material film 40m is partially removed by using, for example, photolithography, thus obtaining a semiconductor chip having a configuration illustrated in FIG. 9.

The foregoing manufacturing method is merely an example, and those of ordinary skill in the art may conceive various manufacturing methods.

The semiconductor chip in which the metallic interconnection is exposed may be used in the same manner as a general semiconductor chip. That is, the metallic interconnection 24 exposed by partial removal of the passivation material film 30m serves as a general semiconductor chip pad, and in this case, the secondary input/output buffer 126 is a dummy circuit that may not be used because the second pad 122B is not formed. According to selection of a mask for partial removal of the passivation material film 30m, only the passivation material film 30m in the non-device region may be partially removed to form the semiconductor chip pad, without forming the contact hole for the second pad 122B.

FIG. 11 is a side cross-sectional view illustrating a semiconductor package 300 according to some embodiments. Referring to FIG. 11, multiple semiconductor chips 320 are stacked on a substrate 310, and the plurality of semiconductor chips 320 include a first semiconductor chip group 320A that is directly electrically connected with the substrate 310 and a second semiconductor chip group 320B that is not directly electrically connected with the substrate 310.

The semiconductor chips 320 illustrated in FIG. 11 may be encapsulated by an encapsulating material such as epoxy molding resin. Herein, for convenience, the encapsulating material is not illustrated. Although eight (8) semiconductor chips are stacked on the substrate 310 in FIG. 11, the number of semiconductor chips stacked may be greater than or less than 8. Herein, for convenience, the semiconductor chips 320 will be referred to as a first chip 320A_1, a second chip 320B_1, a third chip 320B_2, a fourth chip 320B_3, a fifth chip 320A_2, a sixth chip 320B_4, a seventh chip 320B_5, and an eighth chip 320B_6 sequentially from the semiconductor chip closest to the substrate 310.

According to the foregoing definitions of the first semiconductor chip group 320A and the second semiconductor chip group 320B, the first chip 320A_1 and the fifth chip 320A_2 belong to the first semiconductor chip group 320A, and the second chip 320B_1, the third chip 320B_2, the fourth chip 320B_3, the sixth chip 320B_4, the seventh chip 320B_5, and the eighth chip 320B_6 belong to the second semiconductor chip group 320B.

The first chip 320A_1 and the fifth chip 320A_2 of the first semiconductor chip group 320A include a first pad 322A and a second pad 322B, respectively, and the first pad 322A is connected to a pad 312 of the substrate 310 through a first connector 330A and the second pad 322B is connected to a semiconductor chip of the second semiconductor chip group 320B through a second connector 330B. The first chip 320A_1 and the fifth chip 320A_2 of the first semiconductor chip group 320A are each provided with a secondary input/output buffer. The secondary input/output buffer may be similar to those described above and will not be described.

In the embodiment illustrated in FIGS. 1 and 8, as the semiconductor chips are stacked on the substrate, they are offset and stacked in one direction at predetermined intervals. On the other hand, in the embodiment illustrated in FIG. 11, the first chip 320A_1 and the fifth chip 320A_2 of the first semiconductor chip group 320A are disposed in the same position from the vertical point of view, and the semiconductor chips of the second semiconductor chip group 320B corresponding to the first chip 320A_1 and the fifth chip 320A_2 are sequentially offset. Through the foregoing configuration, the footprint of all the stacked semiconductor chips 320 is reduced, allowing efficient use of the area of the substrate 310.

Figure 12:
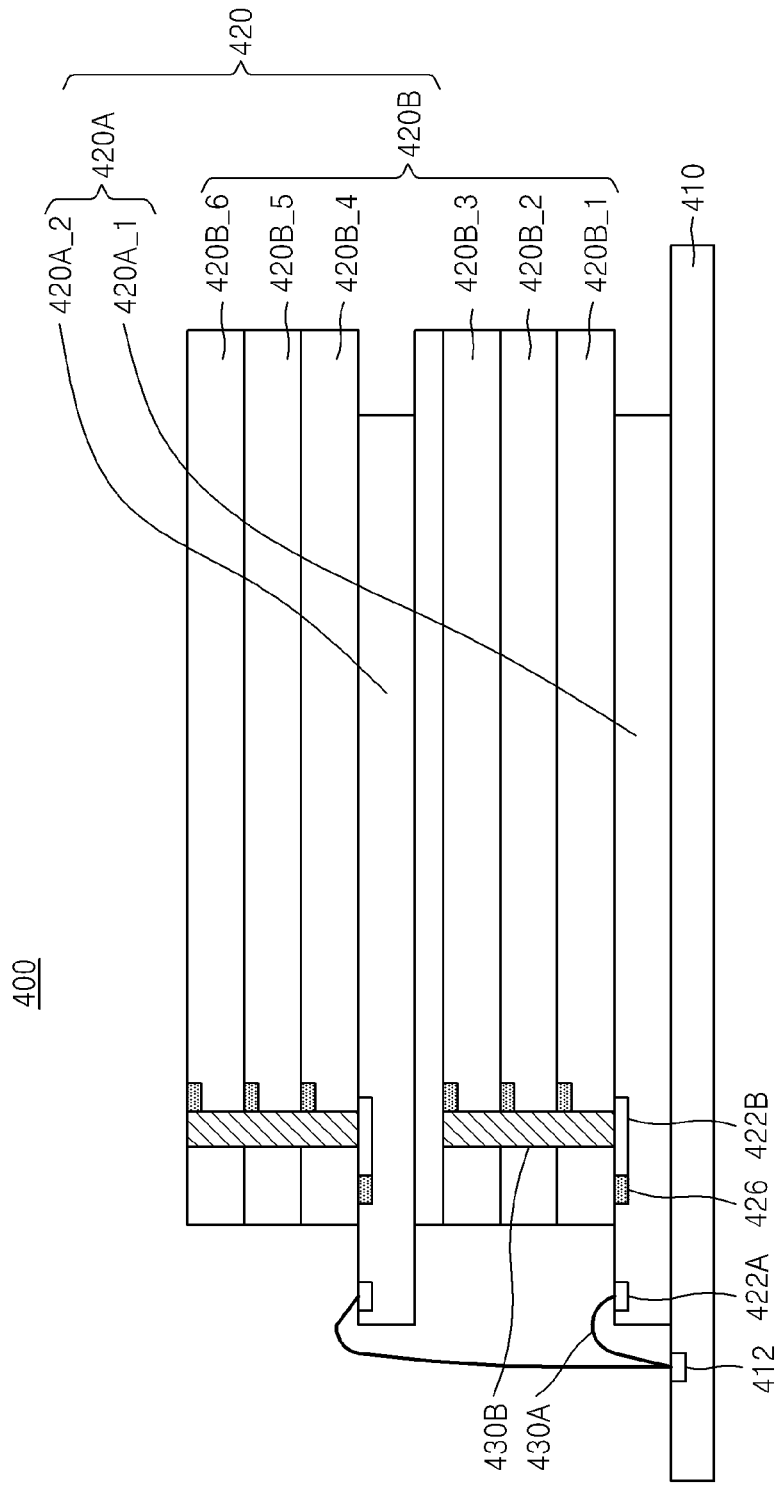

FIG. 12 is a side cross-sectional view illustrating a semiconductor package 400 according to some embodiments. Referring to FIG. 12, multiple semiconductor chips 420 are stacked on a substrate 410, and the semiconductor chips 420 include a first semiconductor chip group 420A that is directly electrically connected with the substrate 410 and a second semiconductor chip group 420B that is not directly electrically connected with at least part of the substrate 410.

Although eight (8) semiconductor chips are stacked on the substrate 410 in FIG. 10, the number of semiconductor chips stacked may be greater than or less than 8. Herein, for convenience, the semiconductor chips 420 will be referred to as a first chip 420A_1, a second chip 420B_1, a third chip 420B_2, a fourth chip 420B_3, a fifth chip 420A_2, a sixth chip 420B_4, a seventh chip 420B_5, and an eighth chip 420B_6 sequentially from the semiconductor chip closest to the substrate 410.

According to the foregoing definitions of the first semiconductor chip group 420A and the second semiconductor chip group 420B, the first chip 420A_1 and the fifth chip 420A_2 belong to the first semiconductor chip group 420A, and the second chip 420B_1, the third chip 420B_2, the fourth chip 420B_3, the sixth chip 420B_4, the seventh chip 420B_5, and the eighth chip 420B_6 belong to the second semiconductor chip group 420B.

The first chip 420A_1 and the fifth chip 420A_2 of the first semiconductor chip group 420A include a first pad 422A and a second pad 422B, respectively, and the first pad 422A is connected to a pad 412 of the substrate 410 through a first connector 430A and the second pad 422B is connected to a semiconductor chip of the second semiconductor chip group 420B through a second connector 430B. Herein, unlike in FIG. 11, the second connector 430B uses a through silicon via (TSV).

Each of the stacked semiconductor chips 420 includes a secondary input/output buffer 426 whose detailed circuit configuration has already been described in FIGS. 2 through 7 and thus will not be described in detail. However, a signal or data input through the first pad 422A and a main input/output buffer may be delivered to an internal circuit of the first chip 420A_1 or toward the second semiconductor chip group 420B via the secondary input/output buffer 426 and the second pad 422B. The signal or data may be delivered along the second connector 430B that is the through silicon via, and then to the internal circuit of a chip through the secondary input/output buffer 426 of that chip.

In FIG. 12, the footprint of all the stacked semiconductor chips 420 is further reduced, allowing efficient use of the area of the substrate 410.

Figure 13:
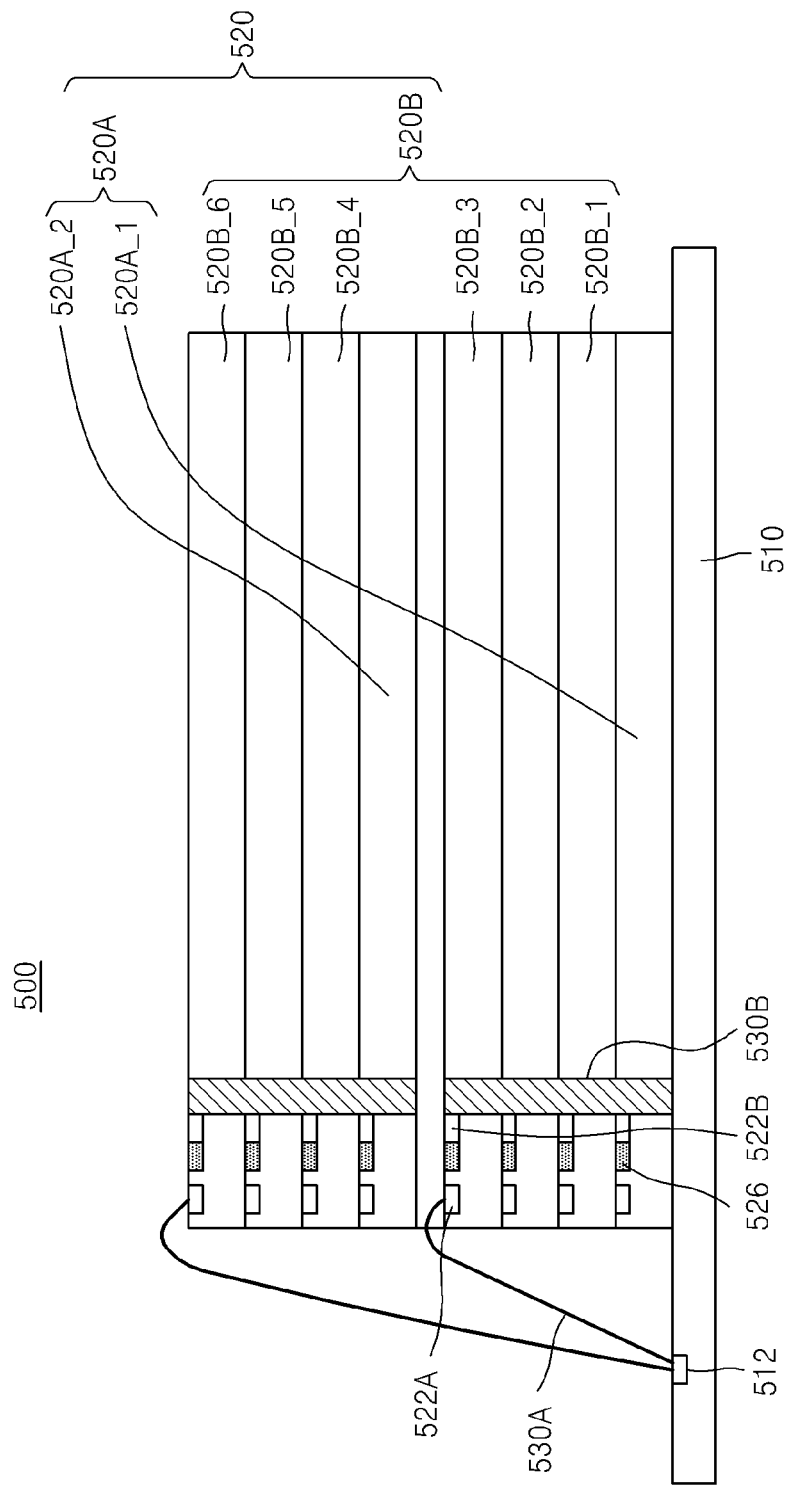

FIG. 13 is a side cross-sectional view illustrating a semiconductor package 500 according to some embodiments. Referring to FIG. 13, multiple semiconductor chips 520 are stacked on a substrate 510, and the semiconductor chips 520 include a first semiconductor chip group 520A directly electrically connected with the substrate 510 and a second semiconductor chip group 520B that is not directly electrically connected with at least part of the substrate 510.

Although eight (8) semiconductor chips are illustrated as being stacked on the substrate 510 in FIG. 13, the number of stacked semiconductor chips may be greater than or less than 8. Herein, for convenience, semiconductor chips 520 will be referred to as a first chip 520B_1, a second chip 520B_2, a third chip 520B_3, a fourth chip 520A_1, a fifth chip 520B_4, a sixth chip 520B_5, a seventh chip 520B_6, and an eighth chip 520A_2 sequentially from the semiconductor chip that is closest to the substrate 510.

According to the foregoing descriptions of the first semiconductor chip group 520A and the second semiconductor chip group 520B, the fourth chip 520A_1 and the eighth chip 520A_2 belong to the first semiconductor chip group 520A, and the first chip 520B_1, the second chip 520B_2, the third chip 520B_3, the fifth chip 520B_4, the sixth chip 520B_5, and the seventh chip 520B_6 belong to the second semiconductor chip group 520B.

The fourth chip 520A_1 and the eighth chip 520A_2 of the first semiconductor chip group 520A include a first pad 522A and a second pad 522B, respectively, and the first pad 522A is connected to a pad 512 of the substrate 510 through a first connector 530A and the second pad 522B is connected to a semiconductor chip of the second semiconductor chip group 520B through a second connector 530B. Herein, the second connector 530B uses a through silicon via. In particular, the second connector 530B passes through the fourth chip 520A_1 and the eighth chip 520A_2 of the first semiconductor chip group 520A.

Each of the stacked semiconductor chips 520 includes a secondary input/output buffer 526 whose detailed circuit configuration has already been described in FIGS. 2 through 7 and thus will not be described in detail. However, a signal or data input through the first pad 522A and a main input/output buffer may be delivered to an internal circuit of the fourth chip 520A_1 or toward the second semiconductor chip group 520B via the secondary input/output buffer 526 and the second pad 522B. The signal or data may be delivered along the second connector 530B, i.e. the through silicon via, and then to the internal circuit of a chip through the second pad 522B and the secondary input/output buffer 526 of that chip.

In FIG. 13, the footprint of the stacked semiconductor chips 520 is reduced, allowing more efficient use of the area of the substrate 510.

Figure 14:
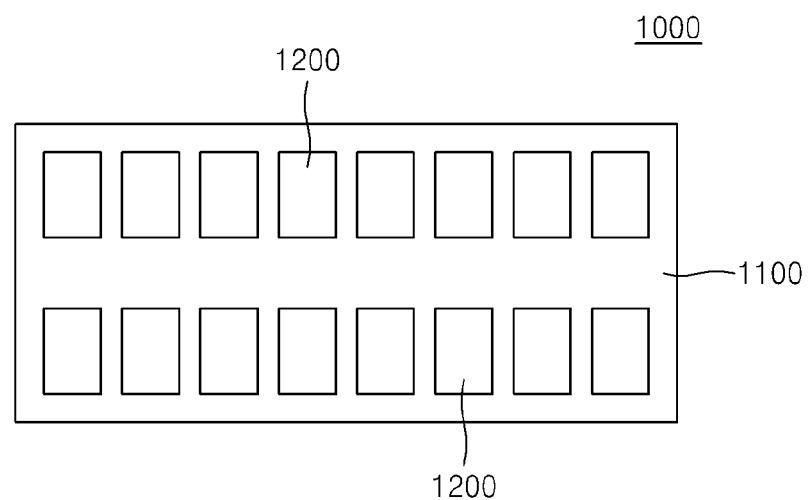
FIG. 14 is a floor plan illustrating a memory module including a semiconductor package according to an embodiment.

FIG. 14 is a floor plan illustrating a memory module 1000 including a semiconductor package according to an embodiment. In this embodiment, the memory module 1000 may include a PCB 1100 and multiple semiconductor packages 1200.

The semiconductor packages 1200 may be or include semiconductor packages as described herein. In particular, the semiconductor packages 1200 may include at least one semiconductor package selected from among semiconductor packages described herein.

The memory module 1000 may be a single in-lined memory module (SIMM) in which the semiconductor packages 1200 are mounted on only one surface of the PCB or a dual in-lined memory module (DIMM) in which the semiconductor packages 1200 are mounted on both surfaces of the PCB. The memory module 1000 may be a fully buffered DIMM (FBDIMM) having an advanced memory buffer (AMB) that provide signals from outside to the semiconductor packages 1200. Although particular types of memory modules have been described, the memory module 1000 may be other types of memory modules that use semiconductor packages.

Figure 15:
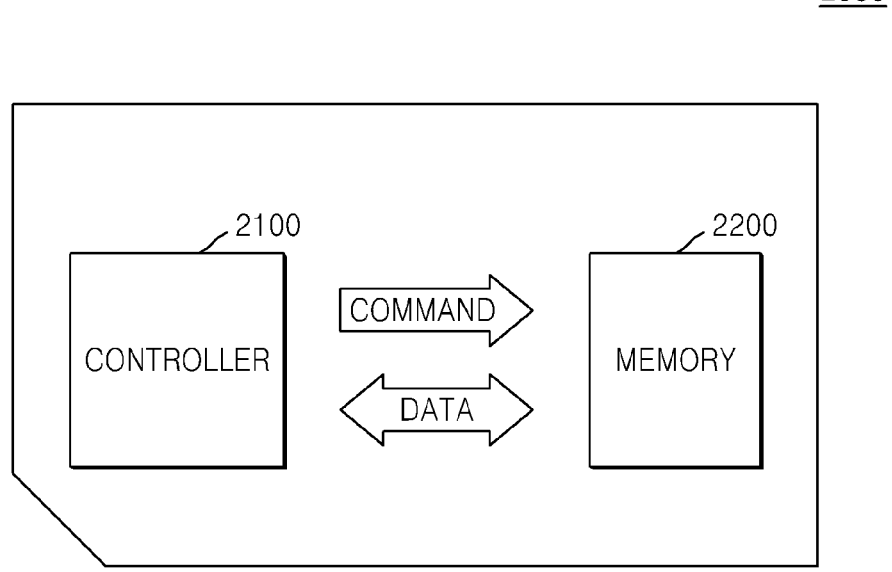
FIG. 15 is a schematic diagram illustrating a memory card including a semiconductor package according to an embodiment.

FIG. 15 is a schematic diagram illustrating a memory card 2000 including a semiconductor package according to an embodiment. In this embodiment, the memory card 2000 may be configured such that a controller 2100 and a memory 2200 are disposed to exchange electric signals. For example, if the controller 2100 may issue a command, the memory 2200 may transmit data to the controller 2100 or receive data from the controller 2100.

The memory 2200 may include a semiconductor memory device packaged as described herein. In particular, the memory 2200 may include at least one semiconductor device selected from among semiconductor memory devices packaged as described herein.

The memory card 2000 may form various types of cards, such as a memory stick card, a smart media card (SM), a secure digital card (SD), a mini-secure digital card (SD), a multimedia card (MMC), or the like.

Figure 16:
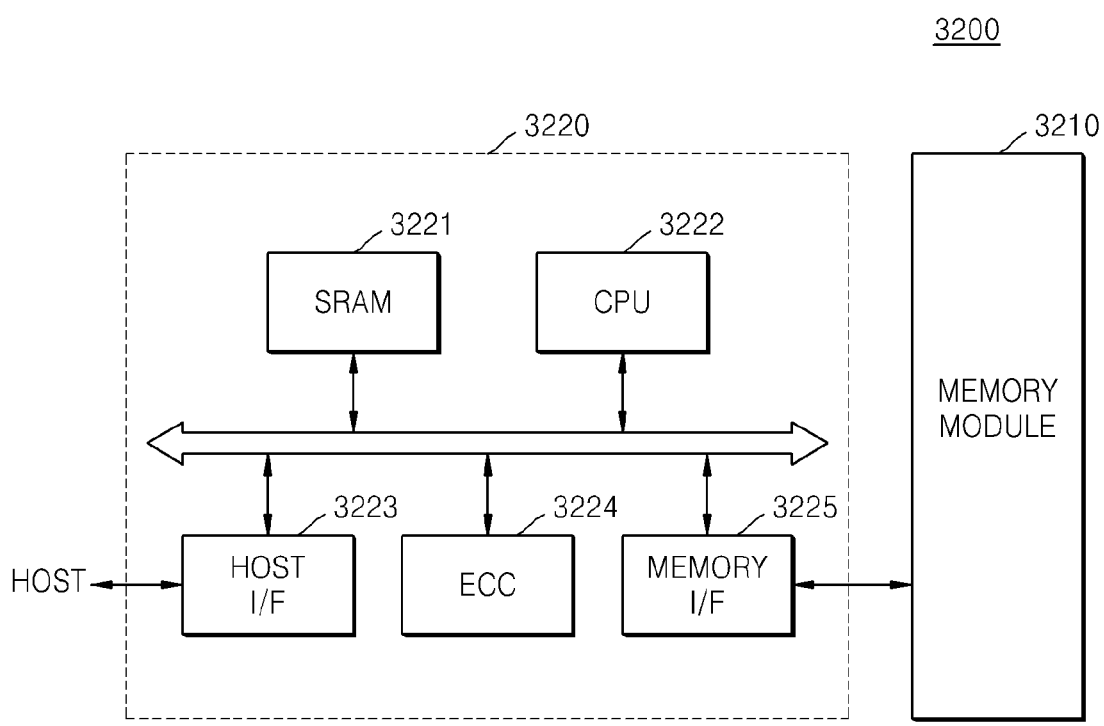
FIG. 16 is a block diagram illustrating an example of a memory device including a semiconductor package according to an embodiment.

FIG. 16 is a block diagram illustrating a memory device 3200 including a semiconductor package according to an embodiment. Referring to FIG. 16, the memory device 3200 includes a memory module 3210 that includes at least one of the semiconductor packages described herein. The memory module 3210 may be a flash memory or other type of memory. The memory module 3210 may further include another form of a semiconductor memory device (for example, a non-volatile memory device, an SRAM device, or the like). The memory device 3200 may include a memory controller 3220 configured to control data exchange between a host and the memory module 3210.

The memory controller 3220 may include a processing unit 3222 configured to control the overall operation of the memory device 3200. The memory controller 3220 may also include an SRAM 3221 configured to be used as an operating memory of the processing unit 3222. The memory controller 3220 may further include a host interface (I/F) 3223 and a memory I/F 3225. The host interface 3223 may be configured to use a data exchange protocol to exchange data between the memory device 3200 and the host. The memory interface 3225 may be configured to connect the memory controller 3220 with the memory module 3210. Moreover, the memory controller 3220 may also include an error correction block (ECC) 3224. The ECC 3224 may be configured to detect and correct an error of data read from the memory module 3210. Although not shown, a read-only-memory (ROM) device configured to store code data for interface with the host may be further included in the memory device 3200. The memory device 3200 may be implemented as a solid state drive (SSD) that replaces a hard disk of a computer system.

Figure 17:
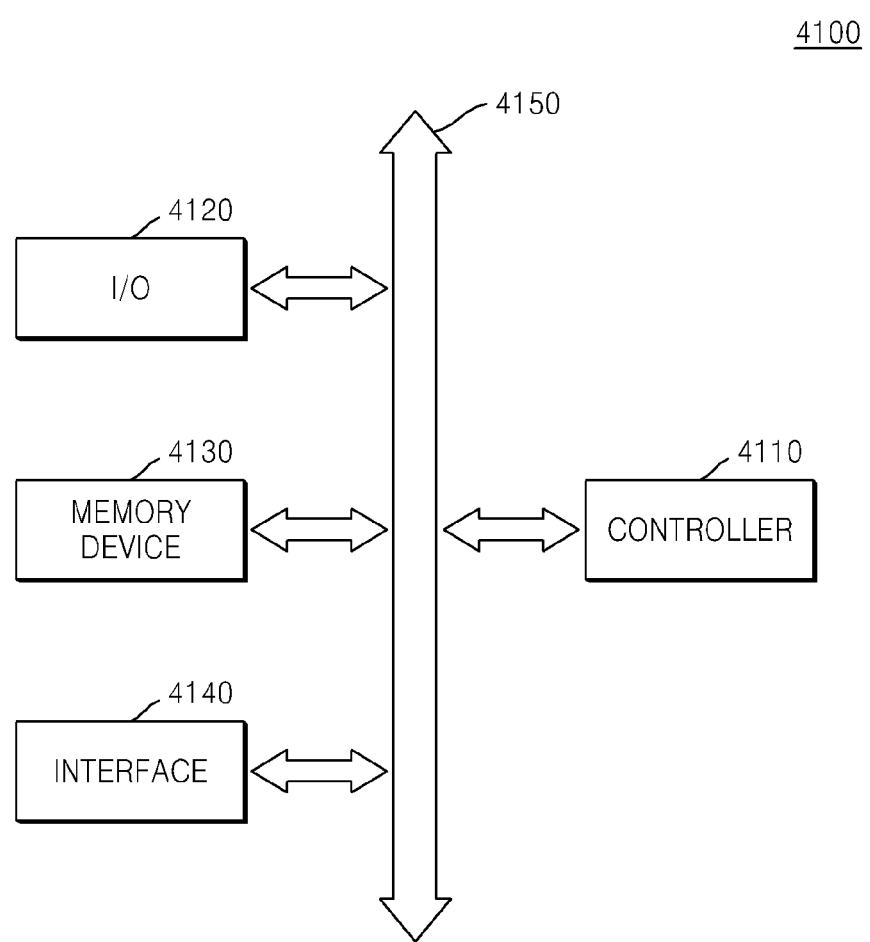
FIG. 17 is a block diagram illustrating an example of an electronic system including a semiconductor package according to an embodiment.

FIG. 17 is a block diagram illustrating an example of an electronic system 1400 including a semiconductor package according to an embodiment. Referring to FIG. 17, the electronic system 4100 may include a controller 4110, an input/output (I/O) device 4120, a memory device 4130, an interface 4140, and a bus 4150. The controller 4110, the I/O device 4120, the memory device 4130, and/or the interface 4140 may be connected to one another through the bus 4150. The bus 4150 may be configured to provide a path through which data moves.

The controller 4110 may include at least one of a microprocessor, a digital signal process, a micro-controller, and logic devices that function in similar ways to them. The I/O device 4120 may include a keypad, a keyboard, a display device, other user interfaces, or the like. The memory device 4130 may be configured to store data, commands, or the like. The memory device 4130 may include at least one of the semiconductor packages described herein. The memory device 4130 may further include another form of a semiconductor memory device (for example, a non-volatile memory device, an SRAM device, or the like). The interface 4140 may be configured to transmit data to a communication network or receive data from the communication network. The interface 4140 may be of a wired or wireless type. For example, the interface 4140 may include an antenna or a wired/wireless transceiver. Although not shown, a high-speed DRAM device and/or SRAM device may be further included in the electronic system 4100 as an operating memory device for improving an operation of the controller 4110.

The electronic system 4100 may be part of a personal digital assistant (PDA), a portable computer, a web tablet, a wireless phone, a mobile phone, a digital music player, a memory card, or any electronic product that may transmit and/or receive information in a wireless environment. However, in other embodiments, the electronic system 4100 need not be capable of communicating over a communication network.

By using the semiconductor package described herein, a high-speed operation is possible even when multiple semiconductor chips are stacked.

An embodiment provides a semiconductor package in which high-speed operations are possible even if multiple semiconductor chips are stacked.

According to an embodiment, a semiconductor package includes multiple semiconductor chips stacked on a substrate. The semiconductor chips include a first semiconductor chip group including semiconductor chips that are directly electrically connected with the substrate and a second semiconductor chip group including semiconductor chips that are not directly electrically connected with the substrate, and the semiconductor chips of the first semiconductor chip group include a main input/output buffer for input/output with the substrate and a secondary input/output buffer for input/output with the semiconductor chips of the second semiconductor chip group.

The secondary input/output buffer may have a smaller buffering capacity than the main input/output buffer. Each of the semiconductor chips of the first semiconductor chip group may include a first pad that communicates with the substrate and a second pad that communicates with a semiconductor chip of the second semiconductor chip group, respectively. The main input/output buffer may be positioned between the first pad and an internal circuit of the semiconductor chip of the first semiconductor chip group. The secondary input/output buffer may be positioned between the first pad and the second pad. In particular, one end of the secondary input/output buffer may be connected to the second pad, and the other end of the secondary input/output buffer may be connected between the main input/output buffer and the internal circuit. Alternatively, one end of the secondary input/output buffer may be connected to the second pad and the other end of the secondary input/output buffer may be connected between the first pad and the main input/output buffer. The first semiconductor chip groups may include two or more semiconductor chips.

Each of the semiconductor chips of the second semiconductor chip group may further include a secondary input/output buffer that is identical to the secondary input/output buffer of each of the semiconductor chips of the first semiconductor chip group. The secondary input/output buffer of the semiconductor chip of the first semiconductor chip group may be electrically connected with the secondary input/output buffer of the semiconductor chip of the second semiconductor chip group. Two or more semiconductor chips of the second semiconductor chip group may correspond to one semiconductor chip of the first semiconductor chip group, and secondary input/output buffers of the semiconductor chips of the second semiconductor chip group may be connected in parallel to a secondary input/output buffer of one semiconductor chip of the first semiconductor chip group.

Optionally, the semiconductor chips of the first semiconductor chip group and the semiconductor chips of the second semiconductor chip group may be substantially identical to one another. Main input/output buffers of the semiconductor chips of the first semiconductor chip group may be electrically connected to the substrate, and secondary input/output buffers of the semiconductor chips of the first semiconductor chip group may be connected in parallel to secondary input/output buffers of multiple semiconductor chips of the second semiconductor chip group.

Each of the stacked semiconductor chips may include a low-speed pad, and the low-speed pads of the stacked semiconductor chips may be connected in parallel to the substrate.

Another embodiment includes a semiconductor package including multiple semiconductor chips stacked on a substrate. The semiconductor package communicates with an external device through one or more channels, the semiconductor chips include a first semiconductor chip group comprising semiconductor chips that are directly electrically connected with the substrate and a second semiconductor chip group comprising semiconductor chips that are not directly electrically connected with the substrate, and each of the semiconductor chips of the first semiconductor chip group includes a first pad that communicates with the substrate and a second pad that communicates with a semiconductor chip of the second semiconductor chip group, respectively, and the first pad and the second pad are used for communication through the same channel.

Active surfaces of the semiconductor chips of the first semiconductor chip group and active surfaces of the semiconductor chips of the second semiconductor chip group may be oriented in the same direction. One pad on the substrate may be directly electrically connected with the first pads.

The number of semiconductor chips of the first semiconductor chip group may be less than or equal to ½ of the number of stacked semiconductor chips. At least two semiconductor chips of the second semiconductor chip group may be electrically connected to each of the semiconductor chips of the first semiconductor chip group, and the pads of the semiconductor chips of the second semiconductor chip group may be connected in parallel to the second pad of the semiconductor chip of the first semiconductor chip group.

The semiconductor package may further include a first connector that electrically connects the substrate with the semiconductor chips of the first semiconductor chip group and a second connector that electrically connects the semiconductor chip of the first semiconductor chip group with the semiconductor chip of the second semiconductor chip group. The second connector may be a bonding wire.

The second pad may be provided on a passivation layer of the semiconductor chip of the first semiconductor chip group, and the second pad may be electrically connected with a contact that passes through the passivation layer. The second pad may be provided on a device region.

The semiconductor chips of the first semiconductor chip group and the semiconductor chips of the second semiconductor chip group may be substantially identical to one another.

According to another embodiment, there is provided a semiconductor package including multiple semiconductor chips stacked on a substrate. Each of the semiconductor chips includes a first pad that communicates with the substrate and a second pad that communicates with another semiconductor chip, and the first pad is connected with a main input/output buffer, and the main input/output buffer is connected with an internal circuit of the semiconductor chip, and the second pad is connected with one end of a secondary input/output buffer, and the other end of the secondary input/output buffer is connected between the main input/output buffer and the internal circuit.

The number of semiconductor chips whose first pads are directly electrically connected to the substrate among the semiconductor chips may be greater than 2 and is less than or equal to ½ of the number of semiconductor chips. In semiconductor chips whose first pads are not directly electrically connected to the substrate among the semiconductor chips, the second pads may be connected to one another.

Each of the semiconductor chips may further include a third pad, and the third pads are connected in parallel to the substrate.

An embodiment includes a semiconductor package including a plurality of semiconductor chips stacked on a substrate. The semiconductor chips are divided into a first semiconductor chip group including semiconductor chips that are directly electrically connected with the substrate and a second semiconductor chip group including semiconductor chips that are not directly electrically connected with the substrate, and the semiconductor chips of the first semiconductor chip group include a main input/output buffer for input/output with the substrate and a secondary input/output buffer for input/output with the semiconductor chips of the second semiconductor chip group. By using the semiconductor package, even when multiple semiconductor chips are stacked, a high-speed operation is possible While embodiments been particularly shown and described with reference to the drawings, it will be understood that various changes in form and details may be made therein without departing from the spirit and scope of the following claims.

What is claimed is:
1. A semiconductor package, comprising:
    a substrate;
    a first semiconductor chip comprising:
        a first pad;
        a second pad;
        an internal circuit;
        a main input/output buffer coupled between the first pad and the internal circuit; and
        a secondary input/output buffer coupled between the first pad and the second pad; and
    at least one second semiconductor chip;
    wherein:
        the first semiconductor chip and the at least one second semiconductor chip are stacked on the substrate;

the first semiconductor chip is electrically connected with the substrate; and
an electrical connection of at least one of the at least one second semiconductor chip is formed through the secondary input/output buffer of the first semiconductor chip.

2. The semiconductor package of claim 1, wherein the main input/output buffer of the first semiconductor chip has a larger buffering capacity than the secondary input/output buffer.

3. The semiconductor package of claim 1, wherein: the electrical connection of each second semiconductor chip is formed through the second pad of the first semiconductor chip.

4. The semiconductor package of claim 3, wherein one end of the secondary input/output buffer is connected to the second pad, and another end of the secondary input/output buffer is connected to a location between the main input/output buffer and the internal circuit.

5. The semiconductor package of claim 3, wherein one end of the secondary input/output buffer is connected to the second pad and another end of the secondary input/output buffer is connected to a location between the first pad and the main input/output buffer.

6. The semiconductor package of claim 1, wherein for each of the at least one second semiconductor chip:
the second semiconductor chip comprises a secondary input/output buffer that is substantially identical to the secondary input/output buffer of the first semiconductor; and
the secondary input/output buffer of the first semiconductor chip is electrically connected with the secondary input/output buffer of the second semiconductor chip.

7. The semiconductor package of claim 1, wherein the first semiconductor chip and the at least one second semiconductor chip are substantially identical to one another.

8. The semiconductor package of claim 1, wherein:
each of the at least one second semiconductor chip comprises a secondary input/output buffer; and
the secondary input/output buffers of the second semiconductor chips are connected in parallel to the second pad of the first semiconductor chip.

9. The semiconductor package of claim 1, wherein the first semiconductor chip and each of second semiconductor chips comprises a low-speed pad, and the low-speed pads are connected in parallel to the substrate.

10. The semiconductor package of claim 1, wherein each of the at least one second semiconductor chip is configured to communicate with an external device through the secondary input/output buffer of the first semiconductor chip.

11. The semiconductor package of claim 1, wherein an active surface of the first semiconductor chip and an active surface of each of the at least one second semiconductor chip are oriented in the same direction.

12. The semiconductor package of claim 1, wherein:
the at least one second semiconductor chip comprises a plurality of second semiconductor chips; and
the second semiconductor chips are connected in parallel to the second pad of the first semiconductor chip.

13. A semiconductor chip, comprising:
a first pad;
a second pad;
an internal circuit;
a main input/output buffer coupled between the first pad and the internal circuit; and
a secondary input/output buffer coupled between the first pad and the second pad.

14. The semiconductor chip of claim 13, wherein:
the second pad is one of a plurality of second pads;
the secondary input/output buffer is one of a plurality of secondary input/output buffers; and
each secondary input output buffer is associated with one of the second pads and coupled between the associated second pad and the first pad.

15. The semiconductor chip of claim 13, wherein the secondary input/output buffer is coupled between the second pad and a location between the internal circuit and the main input/output buffer.

16. The semiconductor chip of claim 13, wherein:
the secondary input/output buffer is coupled between the second pad and a location between the main input/output buffer and the first pad; and
the main input/output buffer is coupled between the location and the internal circuit.

17. A semiconductor package comprising:
a substrate;
a plurality of first semiconductor chips; and
a plurality of second semiconductor chips;
wherein for each of the first semiconductor chips:
the first semiconductor chip comprises:
an internal circuit;
a first pad;
a second pad;
a main input/output buffer coupled between the first pad and the internal circuit; and
a secondary input/output buffer coupled between the first pad and the second pad;
the first semiconductor chip is associated with a plurality of the second semiconductor chips; and
each of the associated second semiconductor chips is coupled to the substrate through the secondary input/output buffer.

18. The semiconductor package of claim 17, wherein for the associated second semiconductor chips of at least one of the first semiconductor chips:
each of the associated second semiconductor chips includes a pad directly electrically connected to at least one of the pad of another associated second semiconductor chip and the second pad of the associated first semiconductor chip.

19. The semiconductor package of claim 17, wherein for the associated second semiconductor chips of at least one of the first semiconductor chips:
each of the associated second semiconductor chips includes a pad directly electrically connected to the second pad of the associated first semiconductor chip.

20. The semiconductor package of claim 17, wherein the number of first semiconductor chips among a total of the first and second semiconductor chips is greater than 2 and is less than or equal to ½ of the total.

21. The semiconductor package of claim 17, wherein:
each first semiconductor chip includes a third pad;
each second semiconductor chip includes a pad; and
the third pad of each first semiconductor chip and the pad of each second semiconductor chip are electrically connected in parallel to the substrate.

22. The semiconductor package of claim 17, wherein the first semiconductor chips are substantially overlapping.

23. The semiconductor package of claim 17, wherein:
the first and second semiconductor chips are stacked on the substrate; and
the second semiconductor chips are offset from each other such that pads of the second semiconductor chips are exposed.

24. The semiconductor package of claim 17, wherein:
the substrate comprises a pad; and
the first pad of each first semiconductor chip is coupled in parallel to the pad of the substrate.

25. A semiconductor package, comprising:
a substrate;
a first semiconductor chip; and
at least one second semiconductor chip;
wherein:
   the first semiconductor chip and the at least one second semiconductor chip are stacked on the substrate;
   the first semiconductor chip is electrically connected with the substrate;
   an electrical connection of each second semiconductor chip is formed through a secondary input/output buffer of the first semiconductor chip; and
   the first semiconductor chip includes a main input/output buffer having a larger buffering capacity than the secondary input/output buffer.

* * * * *